(12) United States Patent
Yamada et al.

(10) Patent No.: US 8,378,484 B2
(45) Date of Patent: Feb. 19, 2013

(54) SEMICONDUCTOR DEVICE, METHOD FOR MANUFACTURING SEMICONDUCTOR DEVICE, AND ELECTRONIC APPLIANCE HAVING THE SEMICONDUCTOR DEVICE

(75) Inventors: Daiki Yamada, Tochigi (JP); Tomoyuki Aoki, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 210 days.

(21) Appl. No.: 11/790,481

(22) Filed: Apr. 25, 2007

(65) Prior Publication Data

US 2007/0252181 A1 Nov. 1, 2007

(30) Foreign Application Priority Data

Apr. 27, 2006 (JP) .................................. 2006-123589

(51) Int. Cl.
*H01L 23/48* (2006.01)
(52) U.S. Cl. . 257/734; 257/288; 257/704; 257/E33.066; 343/912; 235/492
(58) Field of Classification Search .................. 257/704, 257/734, 288, E33.06; 343/912; 235/492
See application file for complete search history.

(56) References Cited

U.S. PATENT DOCUMENTS

| | | | |
|---|---|---|---|
| 6,251,704 B1 | 6/2001 | Ohuchi et al. | |
| 6,259,163 B1 | 7/2001 | Ohuchi et al. | |
| 6,686,650 B1 | 2/2004 | Gogami et al. | |
| 2003/0020158 A1* | 1/2003 | Miura et al. | 257/704 |
| 2003/0049425 A1* | 3/2003 | Ono et al. | 428/217 |
| 2005/0127190 A1* | 6/2005 | Arisawa | 235/492 |
| 2005/0269913 A1* | 12/2005 | Sasaki et al. | 310/366 |
| 2007/0195839 A1* | 8/2007 | Monty et al. | 372/38.05 |
| 2009/0027300 A1* | 1/2009 | Kudo et al. | 343/912 |

FOREIGN PATENT DOCUMENTS

| | | |
|---|---|---|
| EP | 1 167 068 | 1/2002 |
| JP | 11-191565 | 7/1999 |
| JP | 2000-208899 | 7/2000 |
| JP | 2001-175829 | 6/2001 |
| JP | 2003-170566 | 6/2003 |
| JP | 2005-340282 | 12/2005 |

OTHER PUBLICATIONS

International Search Report (Application No. PCT/JP2007/058691) dated Jul. 24, 2007.
Written Opinion (Application No. PCT/JP2007/058691) dated Jul. 24, 2007.

* cited by examiner

*Primary Examiner* — Kenneth Parker
*Assistant Examiner* — Dale E Page
(74) *Attorney, Agent, or Firm* — Eric J. Robinson; Robinson Intellectual Property Law Office, P.C.

(57) ABSTRACT

In order to connect a semiconductor device including an integrated circuit to an external circuit typified by an antenna, the shape of the contact electrode to be formed in the semiconductor device is devised, so that bad connection between the external circuit and the contact electrode is not easily caused and the contact electrode with high reliability is provided. The contact electrode is formed by a screen printing method using a squeegee having a chamfered corner or having a wedge shape. The contact electrode has a peripheral portion and a central portion. The peripheral portion has a tapered portion with its film thickness gradually decreasing from the central portion toward the end portion, and the central portion has a projection portion that continues from the tapered portion.

17 Claims, 16 Drawing Sheets scanning direction pressure scanning direction

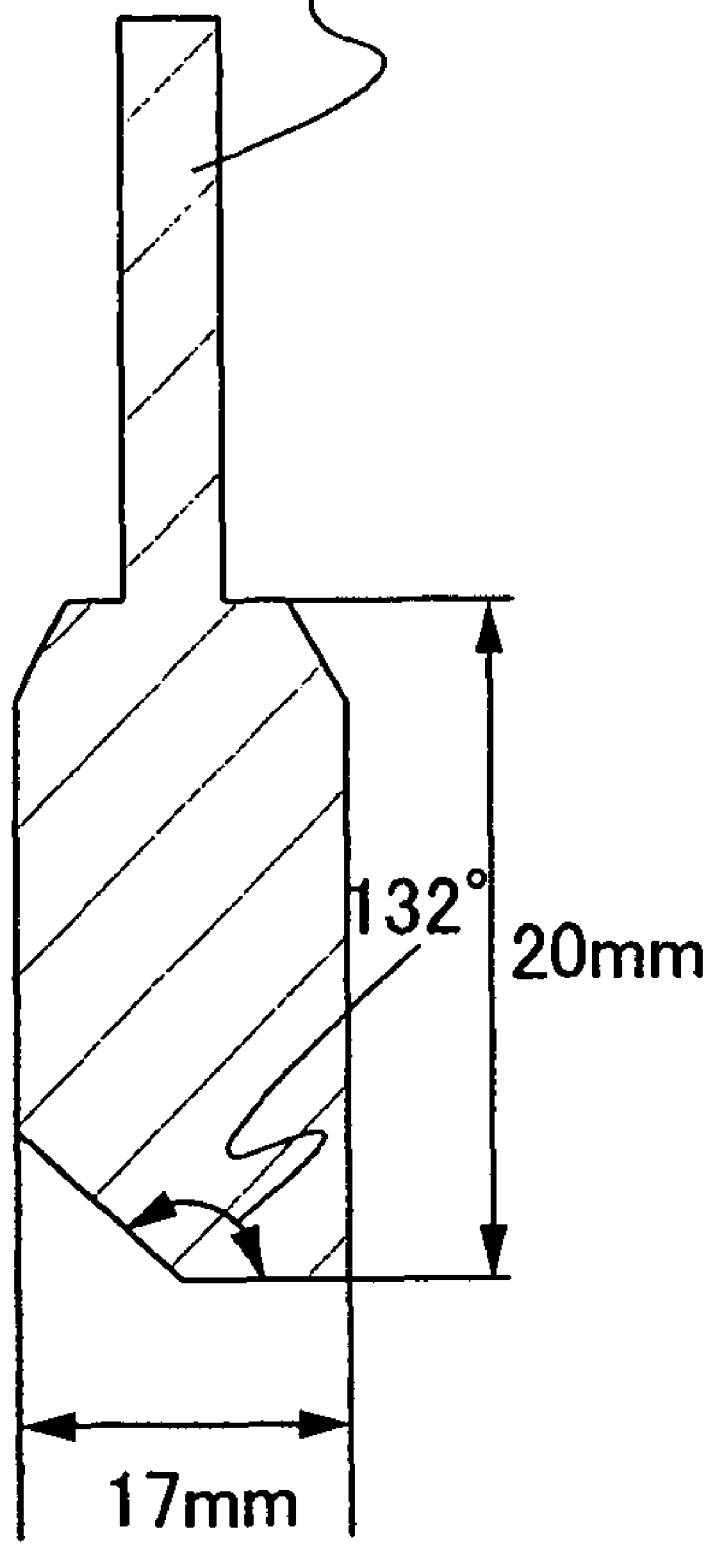

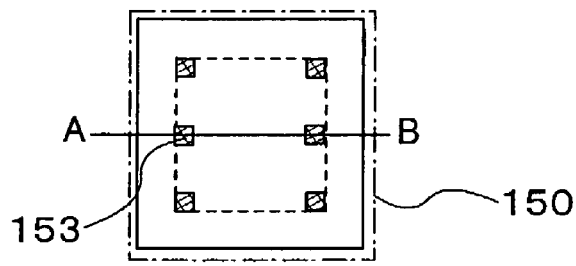
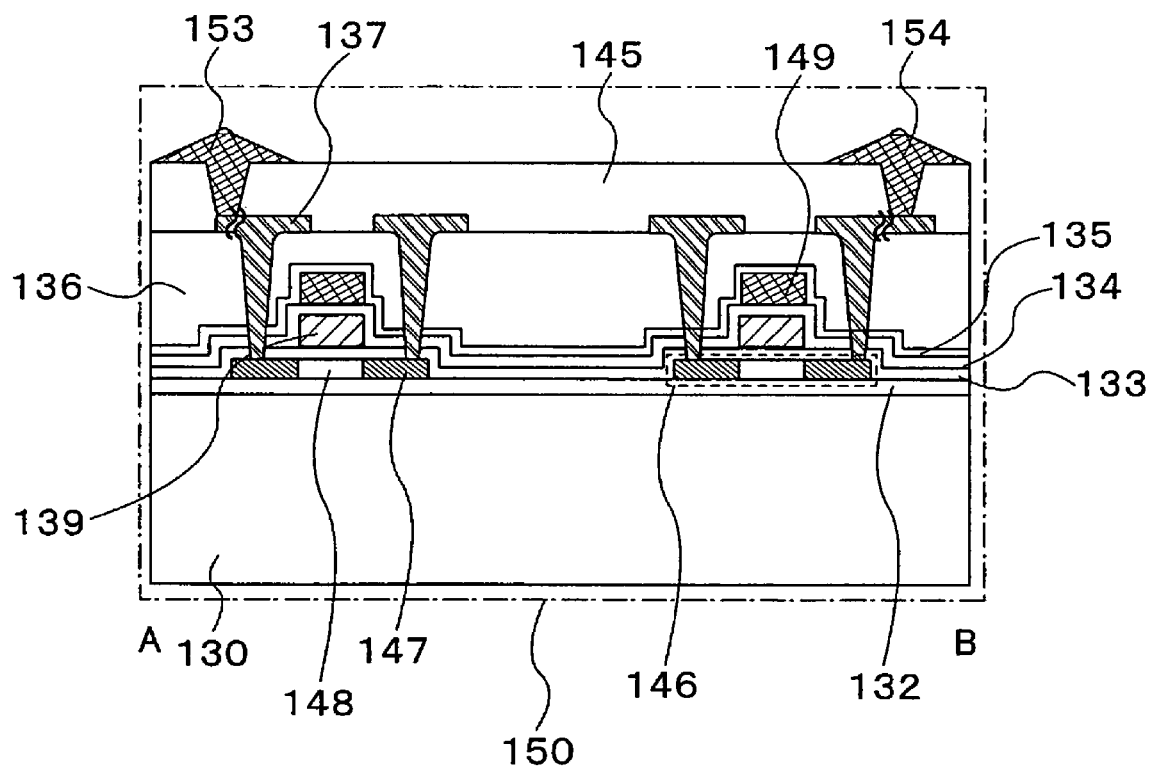

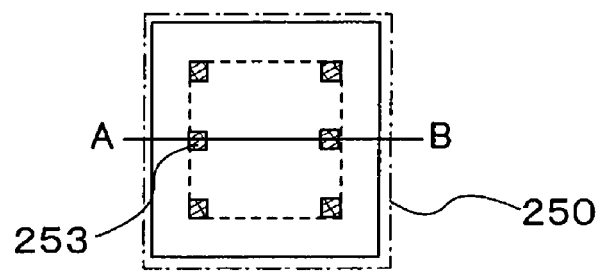
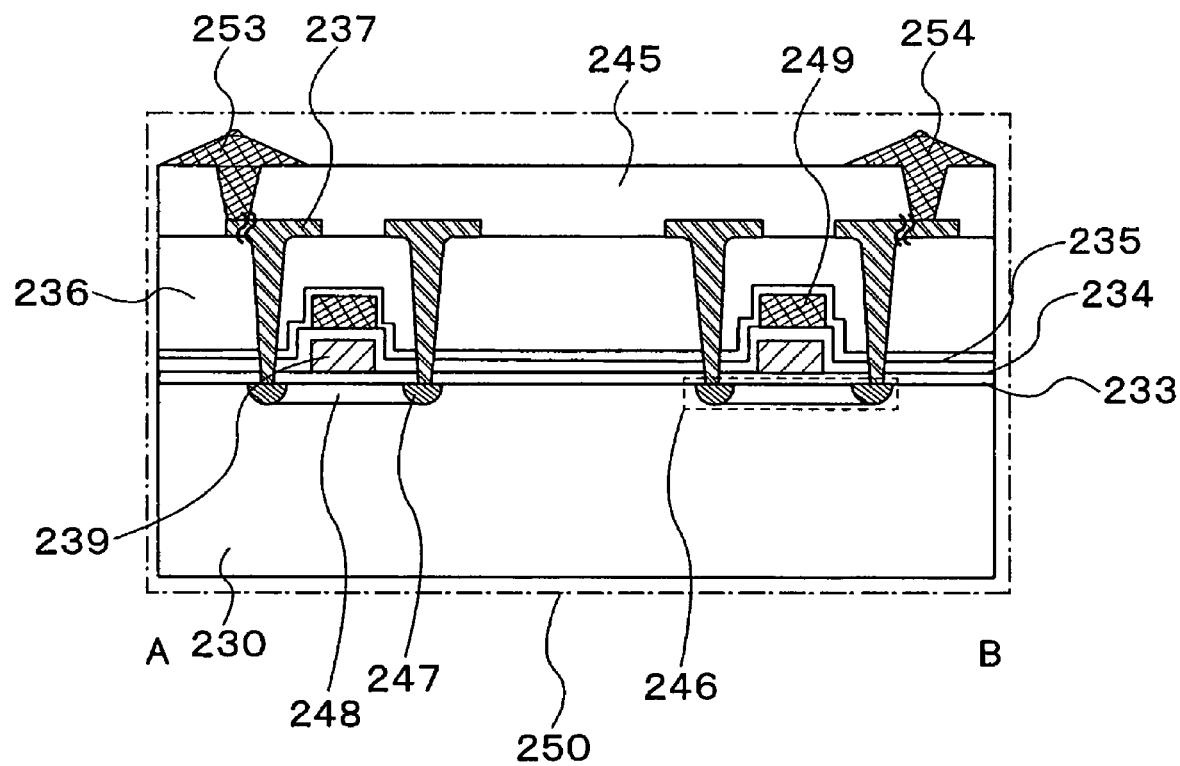

SEMICONDUCTOR DEVICE, METHOD FOR MANUFACTURING SEMICONDUCTOR DEVICE, AND ELECTRONIC APPLIANCE HAVING THE SEMICONDUCTOR DEVICE

TECHNICAL FIELD

The present invention relates to a semiconductor device, a method for manufacturing the semiconductor device, and an electronic appliance having the semiconductor device. In particular, the present invention relates to an electrode formed in the semiconductor device and a method for forming the electrode. It is to be noted that the semiconductor device includes a transistor.

BACKGROUND ART

In recent years, technology on semiconductor devices having thin film transistors (hereinafter referred to as TFTs) has been developed extensively. The manufacturing of a semiconductor device can be broadly classified into anterior steps and posterior steps. One of the posterior steps is a step of cutting semiconductor elements provided with integrated circuits and packaging each of the cut semiconductor elements. In the packaging step, a cover is attached to the cut semiconductor element to protect the semiconductor element from foreign particles. The packaged semiconductor device is called a semiconductor package. Since the semiconductor package can achieve size reduction and capacity increase for circuit mechanisms and appliances, the semiconductor package is widely used for various kinds of electronic appliances. Moreover, by the use of the semiconductor package, assembly and manufacturing process can be simplified and a semiconductor device can be reduced in size.

As a method for forming an electrode that connects a semiconductor device and an external terminal to each other, an electroplating method, a stud bump method, a printing method, or an evaporation method is given. In the stud bump method, an electrode with a sharp apex is formed in such a way that a ball is formed at an edge of a metal wire by thermal energy, the formed ball is bonded with an integrated circuit by capillary while applying pressure thereto, and then the metal wire is cut. When the electrode formed in this manner is inserted in an antenna, the electrode of the semiconductor device can have physical contact with the external terminal. In addition, since the electrode can be formed to have a sharp apex, the stud bump method is known as a method by which favorable electric contact is also possible and which provides high reliability. The stud bump method can be applied to products provided with devices having circuits mounted, such as various integrated circuits to be provided over a mother board (also called a main board) for a computer. Moreover, the stud bump method can also be used to connect an antenna and an integrated circuit of a semiconductor device capable of wireless communication, such as an RFID (Radio Frequency Identification) tag.

When the electrode formed in the semiconductor device, which is to be connected to an external circuit, has a projection portion in its center, the connection between the integrated circuit and the external circuit becomes favorable. This is because, by having a projection portion in the center of the electrode, the connection becomes possible through a connection point of the projection portion (for example, Reference 1: Japanese Published Patent Application No. 2001-175829).

Alternatively, the electrode can be formed by a screen printing method. As an example of a technique for forming an electrode by a screen printing method, for instance, Reference 2 (Japanese Published Patent Application No. 2005-340282) is given.

DISCLOSURE OF INVENTION

When the semiconductor device and the external circuit are connected to each other through the electrode having a projection portion in the center, a contact area at the connection portion is so small that an area where current flows is small, and there is a risk that they are disconnected from each other due to generated Joule heat.

In addition, since the stud bump method uses a special apparatus, when the electrode having a projection portion in the center is formed by the stud bump method, there were problems in that the number of steps increased, the cost increased, and the productivity decreased.

In order to form the electrode that assures physical contact and makes electric contact favorable as well as to increase the contact area at the connection portion, it is necessary to devise the shape of the projection portion in the center of the electrode. FIGS. 2A to 2C show schematic views of electrodes with various shapes of projection portions. FIG. 2A shows a columnar electrode 21 provided on a surface 20 where the electrode is formed. FIG. 2B shows a subulate electrode 22. FIG. 2C shows a tack-shaped electrode 25 having a flat peripheral portion 23 and a sharp projection portion 24.

As for the columnar electrode shown in FIG. 2A, when a film is formed over this electrode, for example, the film cannot cover the electrode sufficiently and moreover it is difficult for the electrode to be closely in contact with an external circuit favorably, which is to be connected in a later step. As for the subulate electrode shown in FIG. 2B, it is easier for the electrode to be closely in contact with an external circuit than for the electrode with the columnar shape shown in FIG. 2A; however, the connected external circuit may be separated. Since the tack-shaped electrode shown in FIG. 2C has the sharp projection portion 24 in the center, the electrode is connected to the external circuit with the sharp projection portion 24 inserted in the external circuit; however, the flat peripheral portion 23 around the projection portion is difficult to be closely in contact. Therefore, it is necessary to devise the shape of the electrode so that the physical contact is assured and the electric contact becomes favorable.

Moreover, conventionally, an ACP (Anisotropic Conductive Paste) has been provided between the integrated circuit and the external circuit. The ACP is a resin paste in which conductive particles are dispersed and which contributes to electrical connection; however, it may damage an element in a pressure bonding step. Further, since the ACP is expensive, it hinders cost reduction.

In view of the aforementioned problems, the present invention provides an electrode which can be used for the connection portion between the integrated circuit and the external circuit, a semiconductor device having the electrode, and an electronic appliance.

A semiconductor device of the present invention has an electrode to be connected to an integrated circuit and an external circuit. The electrode has an end portion, a central portion having a projection portion, and a peripheral portion between the end portion and the central portion. The peripheral portion has a gently tapered shape with its film thickness decreasing from the central portion toward the end portion, and the projection portion has a gently tapered shape. When the semiconductor device is capable of wireless communication, the external circuit may be an antenna. The external circuit may include a conductive film provided over a base such as a film of polyethylene. The electrode is preferably formed by a screen printing method.

An electronic appliance of the present invention includes a semiconductor device having an integrated circuit and an electrode, and an external circuit to which the electrode is connected. The electrode connecting the semiconductor device and the external circuit to each other has an end portion, a central portion having a projection portion, and a peripheral portion between the end portion and the central portion. The peripheral portion has a gently tapered shape with its film thickness decreasing from the central portion toward the end portion, and the projection portion has a gently tapered shape. The electrode is preferably connected to the external circuit physically. When the semiconductor device is capable of wireless communication, the external circuit may be an antenna. The external circuit may include a conductive film provided over a base such as a film of polyethylene. The electrode is preferably formed by a screen printing method.

In addition, since the electrode and the external circuit are connected favorably to each other in the semiconductor device or the electronic appliance of the present invention, it is not necessary to interpose conductive particles between the external circuit and the electrode, and the external circuit and the electrode may be connected to each other through an insulating substance. That is to say, they may be connected to each other through an NCP (Non-Conductive resin Paste), instead of the ACP.

A method for manufacturing a semiconductor device of the present invention is a method for forming an electrode to be connected to an integrated circuit over a chip provided with the integrated circuit, by a screen printing method using a printing plate having a screen mesh. The method of the present invention includes filling a hole of a pattern of the screen mesh by scanning a scraper, setting the chip under the screen mesh, and applying the ink to the screen mesh by scanning a squeegee over the screen mesh having the ink, so that the electrode is formed over the chip. At this time, the scanning speed x of the squeegee ranges from 0.15 m/sec to 0.20 m/sec. The pressure y applied by the squeegee in a direction perpendicular to the printing plate of the squeegee ranges from 94 MPa to 188 MPa and is set so as to satisfy $1280x-103 \leq y \leq 2240x-217$.

In the method for manufacturing a semiconductor device of the present invention, the squeegee preferably has a shape with its corner chamfered or a wedge shape.

It is to be noted that, in the present invention, "connection" means electrical connection. Therefore, in the structures disclosed in the present invention, another element allowing electrical connection (such as a switch, a transistor, a capacitor, an inductor, a resistor, or a diode) may be interposed in addition to a predetermined connection relation.

According to the present invention, the area where the integrated circuit and the external circuit are in contact with each other at their connection portion increases, so that their connection becomes favorable. When the contact area increases, electrical connection becomes favorable. Furthermore, an expensive ACP, which has been necessary to favorably connect the integrated circuit and the external circuit to each other, is no longer necessary, and an inexpensive NCP (Non-Conductive resin Paste) can be used. Since the NCP does not include conductive particles, it allows the connection without damaging the elements. Accordingly, semiconductor devices with high reliability can be manufactured at low cost and with high yield.

By the present invention, the integrated circuit and the external circuit are physically connected to each other, and moreover electrically connected favorably to each other. In addition, by the use of a screen printing method, the process can be simplified.

By the present invention, bad connection at the connection portion between the integrated circuit and the antenna of the semiconductor device having the antenna capable of wireless communication can be reduced, and semiconductor devices with high reliability capable of wireless communication can be manufactured with high yield.

BRIEF DESCRIPTION OF DRAWINGS

In the accompanying drawings:

FIG. 9 shows shape and size of a squeegee used for forming an electrode of the present invention;

FIGS. 13A and 13B explain a semiconductor device of the present invention;

FIGS. 15A and 15B explain a semiconductor device of the present invention; and

BEST MODE FOR CARRYING OUT THE INVENTION

Figure 1A:
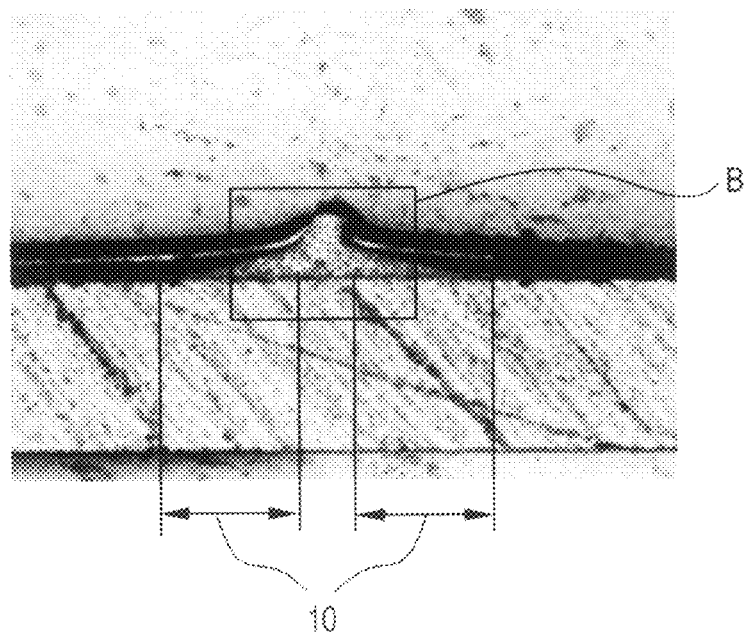
FIGS. 1A and 1B show a shape of an electrode formed in accordance with the present invention.

Embodiment modes and an embodiment of the present invention will be explained in detail with reference to the drawings. However, the present invention is not limited to the following description, and it is easily understood by those skilled in the art that the mode and detail can be variously changed without departing from the scope and spirit of the present invention. Therefore, the present invention is not construed as being limited to the description of the embodiment modes and embodiment hereinafter shown. It is to be noted that a reference numeral indicating the same part is used in common in different drawings in the structures of the present invention described below.

Embodiment Mode 1

Figure 1B:
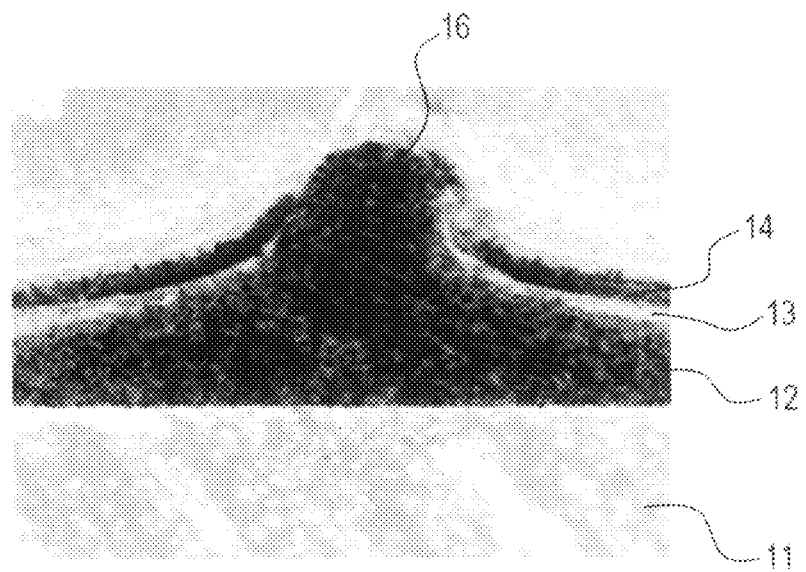
Figure 2A:
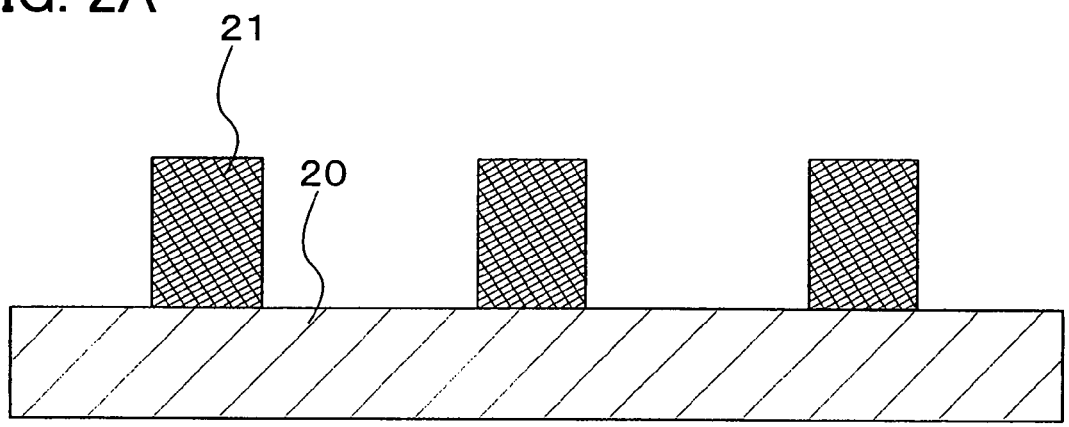
FIGS. 2A to 2C show electrodes with various shapes other than that of the present invention.
Figure 2B:
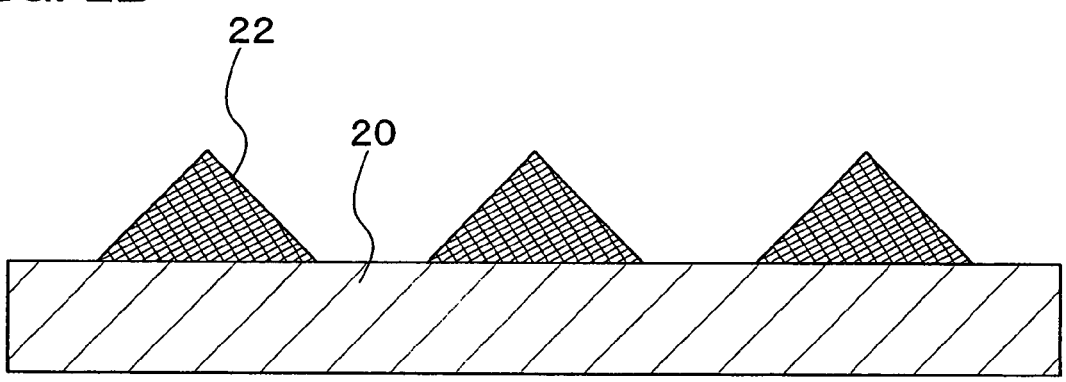
Figure 2C:
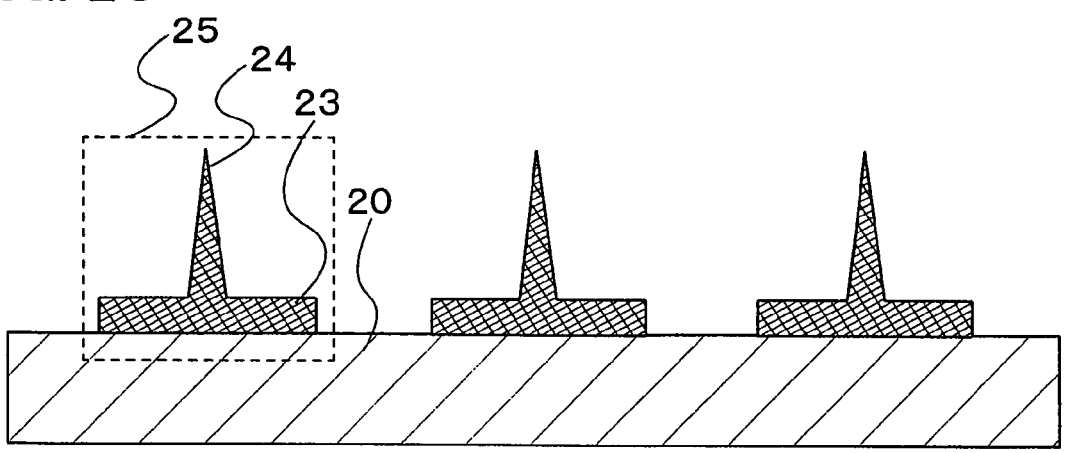

This embodiment mode will explain an electrode of a semiconductor device of the present invention with reference to FIGS. 1A and 1B.

FIGS. 1A and 1B show an electrode 12 of a semiconductor device of the present invention, which connects an external circuit and an integrated circuit to each other. The electrode 12 shown in FIGS. 1A and 1B includes a peripheral portion 10 having a gently tapered shape with its film thickness decreasing from a central portion toward an end portion, and a projection portion 16 having a shape with its tilt angle continuously changing from the peripheral portion toward the central portion. This projection portion 16 makes connection between the integrated circuit and the external circuit favorable. Moreover, since the peripheral portion 10 has the gently tapered shape with its film thickness decreasing from the central portion toward the end portion, it is easy for the peripheral portion 10 with the tapered shape to be closely in contact with the external circuit, and this can increase the contact area. Thus, the electrode of the integrated circuit and the external circuit can be physically connected to each other, and electrically connected to each other favorably.

The electrode provided in order for the semiconductor device of the present invention to connect to the external circuit is formed by a screen printing method. The screen printing is performed while adjusting the pressure and speed of a squeegee with its corner chamfered or a squeegee with a wedge shape. A squeegee with a predetermined shape is used in the screen printing, and the pressure and speed when scanning the squeegee are adjusted so as to be in a certain range. Thus, the electrode including the peripheral portion having the gently tapered shape with its film thickness decreasing from the central portion toward the end portion and the projection portion having the shape with its tilt angle continuously changing from the peripheral portion toward the center portion can be formed.

Embodiment Mode 2

Figure 3A:
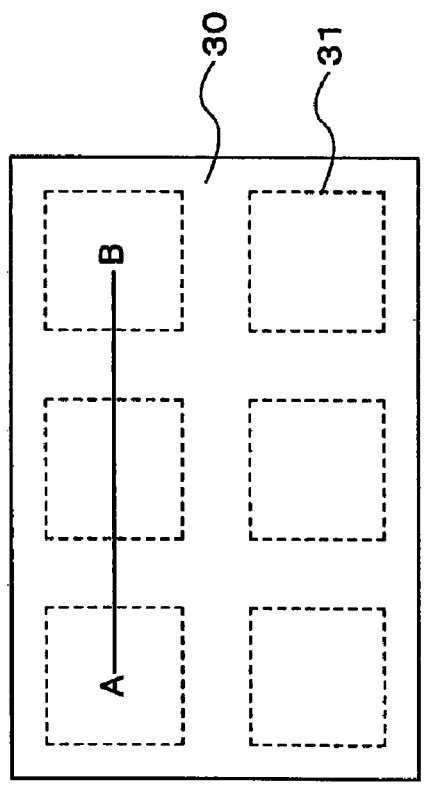
FIGS. 3A and 3B explain a semiconductor device of the present invention.
Figure 4A:
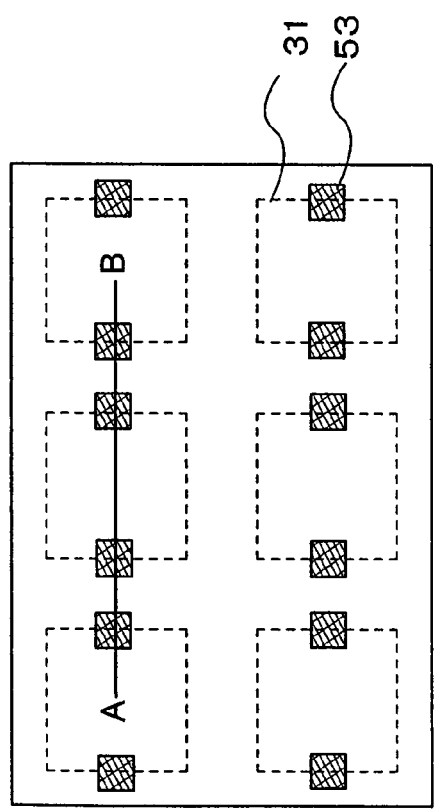
FIGS. 4A and 4B explain a semiconductor device of the present invention.
Figure 4B:
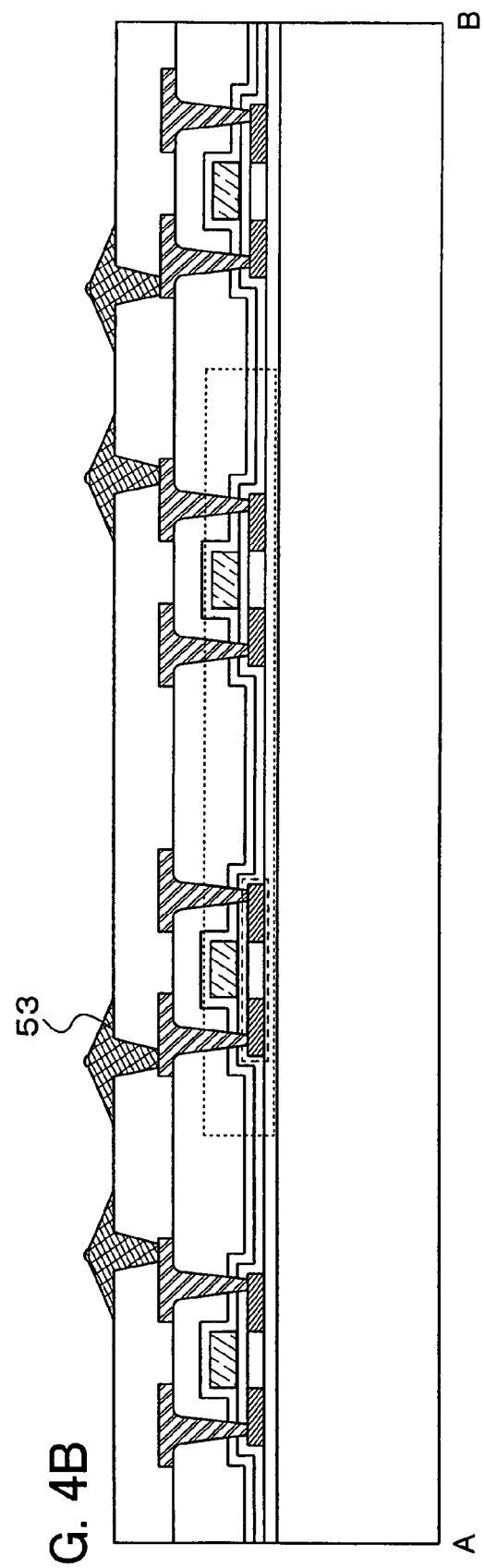
Figure 5A:
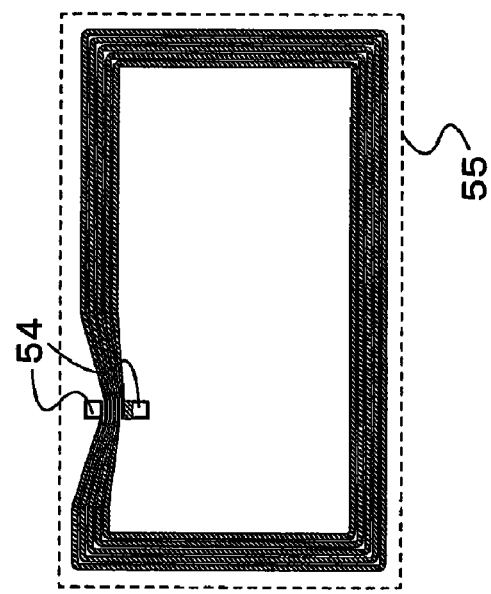
FIGS. 5A to 5C explain a semiconductor device of the present invention.

An example of a method for manufacturing a semiconductor device, to which the present invention is applied, is explained with reference to FIGS. 3A to 9. In this embodiment mode, description is made of a case of manufacturing six thin film integrated circuits over a substrate 30. In FIGS. 3A to 5C, a region to be provided with one thin film integrated circuit corresponds to a region 31 surrounded by a dotted line, which is shown in FIGS. 3A, 4A, and 5A. Each of FIGS. 3B, 4B, and 5B corresponds to a cross sectional view along a line A-B of each of FIGS. 3A, 4A, and 5A.

Figure 3B:
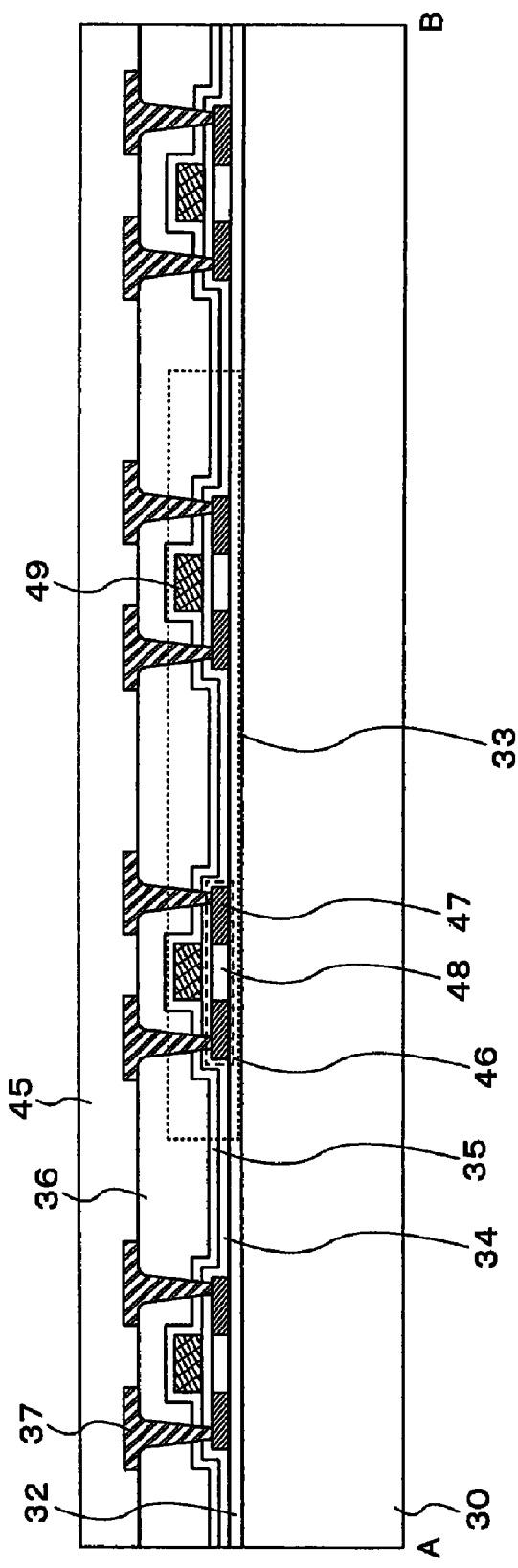

First, an insulating layer 32 is formed on one surface of the substrate 30 (see FIG. 3B). Subsequently, a layer including a plurality of transistors 33 is formed over the insulating layer 32 by a semiconductor layer 46, an insulating layer 34, and a conductive layer 49. Next, an insulating layer 35 and an insulating layer 36 are formed sequentially over the layer including the plurality of transistors 33. Then, a conductive layer 37 connected to a source or drain region of each of the plurality of transistors 33 is formed through openings provided in the insulating layers 34, 35, and 36 in the plurality of transistors 33. Next, an insulating layer 45 is formed covering the conductive layer 37.

The substrate 30 may be a glass substrate, a plastic substrate, a silicon substrate, a quartz substrate, or the like. A glass substrate or a plastic substrate is preferably used. When a glass substrate or a plastic substrate is used as the substrate, it is easy to manufacture a semiconductor device with a length of 1 meter or more on one side or a semiconductor device with a desired shape. Therefore, for example when a large glass or plastic substrate having a square shape with a length of 1 meter or more on one side is used, the productivity can be drastically improved.

The insulating layer 32 serves to prevent the intrusion of impurities from the substrate 30, and is also referred to as a base layer. The insulating layer 32 is formed by a silicon oxide based film or a silicon nitride based film as a single layer or stacked layers by a sputtering method, a plasma CVD method, or the like. The silicon oxide based film is a film formed of a substance including silicon and oxygen as its main components, and corresponds to a silicon oxide film, a silicon oxynitride film, and the like. The silicon nitride based film is a film including silicon and nitrogen as its main components, and corresponds to a silicon nitride film, a silicon nitride oxide film, and the like. When a substrate not including impurities, such as a quartz substrate, is used as the substrate 30, the insulating layer 32 does not have to be provided.

In this specification, it is to be noted that silicon oxynitride refers to a substance of which composition ratio of oxygen is higher than that of nitrogen and can also be called silicon oxide including nitrogen. Similarly, silicon nitride oxide refers to a substance of which composition ratio of nitrogen is higher than that of oxygen and can also be called silicon nitride including oxygen.

Each of the plurality of transistors 33 includes the semiconductor layer 46, the insulating layer 34, and the conductive layer 49 which serves as a gate electrode. The semiconductor layer 46 can be formed of silicon. The semiconductor layer 46 is formed by an LPCVD method, a plasma CVD method, a vapor growth method, or a sputtering method using a semiconductor material gas typified by silane. Since the semiconductor film formed here is amorphous, the semiconductor film is preferably crystallized. The amorphous semiconductor film can be crystallized by a laser crystallization method, a thermal crystallization method, a thermal crystallization method using an element promoting crystallization such as nickel, or the like. In this embodiment mode, the semiconductor layer is formed of polycrystalline semiconductor.

The semiconductor layer 46 has impurity regions 47 each functioning as a source or drain region, and a channel formation region 48. To the impurity regions 47, an impurity element imparting N-type conductivity (an element belonging to Group 15, such as phosphorus (P) or arsenic (As)) or an impurity element imparting P-type conductivity (boron (B) or aluminum (Al)) is added. The impurity element may be introduced by a method using a diffusion source, an ion implantation method, or the like. Although not shown, an LDD (Lightly Doped Drain) region is preferably formed when introducing the impurity element. In particular, it is effective to provide an LDD region in an N-type TFT to which an impurity element imparting N-type conductivity (an element belonging to Group 15, such as phosphorus (P) or arsenic (As)) is introduced as the impurity element.

It is to be noted that in a TFT formed of polycrystalline semiconductor, the LDD region is a region that is formed in order to improve the reliability. For example, it is important to suppress off current in a TFT of which semiconductor layer is formed of polycrystalline silicon. In particular, sufficiently low off current is necessary when the TFT is used as an analog switch in a pixel circuit or the like. However, leak current flows through a defect even when the TFT is off, due to a reverse-bias intense electric field at a drain junction portion. Since the electric field in the vicinity of a drain edge is relaxed by the LDD region, the off current can be reduced. Moreover, the reverse-bias electric field at the drain junction portion can be diffused to a portion where the channel region is bonded with the LDD region and a portion where the LDD region is bonded with the drain region. Thus, since the electric field can be relaxed, the leak current can be reduced.

The insulating layer 34 is a gate insulating layer. Similarly to the insulating layer 32, the insulating layer 34 may be formed by a silicon oxide based film or a silicon nitride based film as a single layer or stacked layers by a sputtering method, a plasma CVD method, or the like.

The conductive layer 49 may be formed of a conductive substance, and the material and forming method thereof are not limited in particular. The conductive layer 49 may be formed by a CVD method, a sputtering method, a droplet discharging method, or the like.

The insulating layers 35 and 36 are formed of an inorganic or organic material as a single layer or stacked layers by an SOG (Spin-On-Glass) method, a droplet discharging method, a screen printing method, or the like. For example, the insulating layer 35 may be formed by a silicon nitride based film, while the insulating layer 36 may be formed by a silicon oxide based film. In addition, the insulating layer 36 may be formed by a sputtering method, a plasma CVD method, or the like similarly to the insulating layers 32 and 34.

The conductive layer 37 is formed of a conductive substance, and may be formed of a similar material to that of the conductive layer 49 by a CVD method, a sputtering method, a droplet discharging method, or the like. The conductive layer 37 may be formed as a single layer or stacked layers.

The insulating layer 45 is preferably formed of an inorganic or organic material as a single layer or stacked layers by an SOG (Spin-On-Glass) method, a droplet discharging method, a screen printing method, or the like, similarly to the insulating layers 35 and 36. The insulating layer 45 may be formed by a sputtering method, a plasma CVD method, or the like similarly to the insulating layers 32 and 34.

Although only the plurality of transistors 33 are formed in the illustrated structure, the present invention is not limited to this structure. The elements to be provided over the substrate 30 may be appropriately adjusted in accordance with the purpose of the semiconductor device. In a case of manufacturing a semiconductor device having a function of storing data, a plurality of transistors and a memory element (such as a transistor or a memory transistor) are preferably formed over the substrate 30. In a case of manufacturing a semiconductor device with a function of controlling a circuit, a function of generating signals, and the like (such as a CPU or a signal generating circuit), a transistor is preferably formed over the substrate 30. In addition to those above, another element such as a resistor or a capacitor may be formed as necessary.

Next, an electrode for connecting to the outside is formed at a desired position. The electrode is formed at a position where a desired wire in an integrated circuit is exposed (see FIGS. 4A and 4B). Here, the electrode is formed over the elements (over the insulating layer 45) by a screen printing method. The screen printing method is a method by which a hole of a pattern drawn on a printing plate is filled with ink and the pattern drawn on the printing plate is transferred to a subject, thereby forming the pattern. Although the electrode is formed over the elements formed over the substrate in this embodiment mode, the electrode may be formed on the opposite side, i.e., at the bottom surface of the substrate.

Figure 8A:
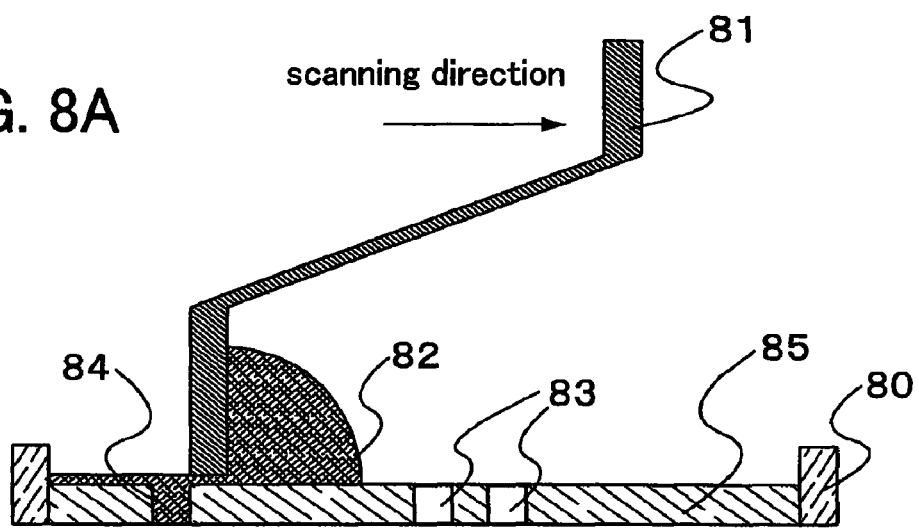
FIGS. 8A and 8B explain an example of forming an electrode of the present invention.
Figure 8B:
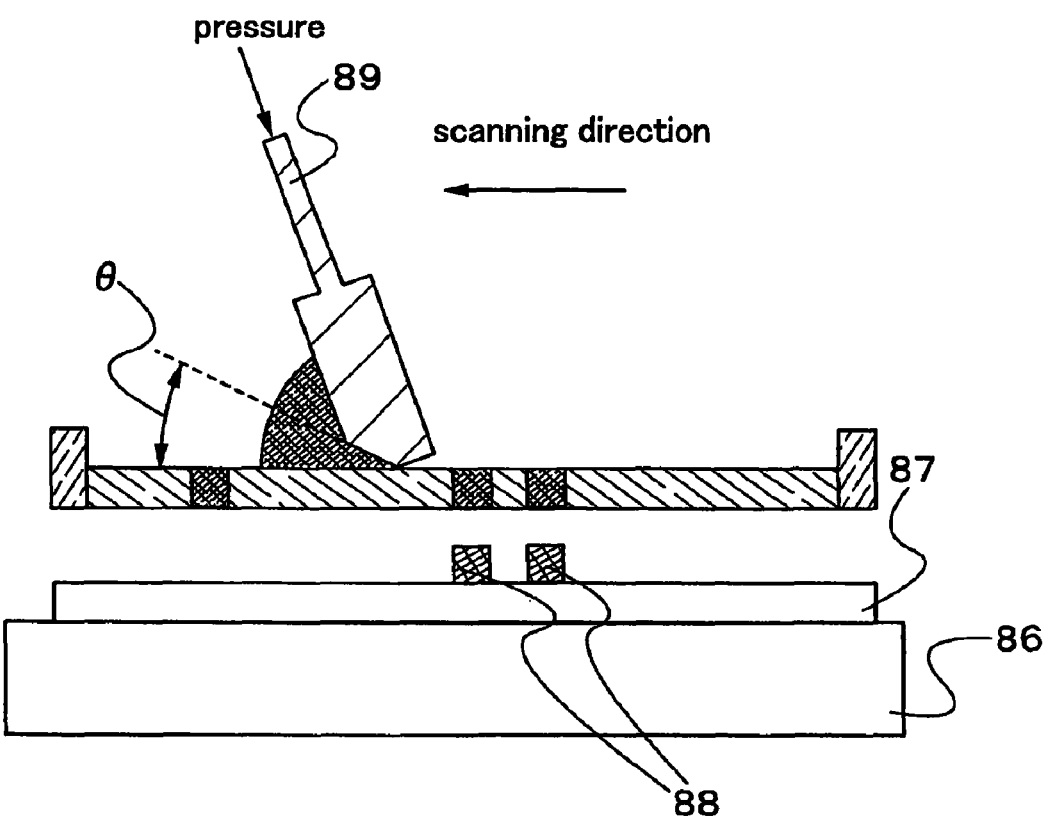

Description is made of the screen printing method used in this embodiment mode with reference to FIGS. 8A and 8B. It is to be noted that the condition of the screen printing hereinafter explained is just an example, and the present invention is not limited to this. FIGS. 8A and 8B each show a cross-sectional view of a state at the time of pattern formation using screen printing. Here, a conductive paste is used as ink 82. As the conductive paste, a copper paste, a nickel paste, an aluminum paste, or a gold paste is preferably used. It is more preferable to use a silver paste. In the case of using the silver paste, an epoxy resin may be used as a binder of the paste and butylcarbitol acetate may be used as a solvent. The viscosity of the silver paste is 40 Pa·s. The printing plate to be used has an exterior frame 80 and a screen mesh 85. In order to fill holes 83, which are provided at desired positions in the screen mesh, with ink, the ink 82 is applied to the screen mesh 85 by using a scraper 81. By the application of the ink 82, the holes 83 are filled with the ink, thereby obtaining holes 84 filled with the ink. Subsequently, a subject 87 on which the electrode is to be formed is provided on a printing stage 86 and the printing stage 86 is then provided under the printing plate.

The printing is performed in such a way that a squeegee 89 is scanned over the screen mesh 85 having the holes 84 filled with the ink. The shape and size of the squeegee used in this embodiment mode are shown in FIG. 9. The squeegee 89 is DB-R Squeegee (manufactured by Microtek, Inc.) with a hardness of 70±5°. A portion of the squeegee 89 that is in contact with the ink 82 has been chamfered. The angle between the bottom of the squeegee and the chamfered portion is 132°, and the squeegee is scanned tilted by about 20° from a perpendicular state. Therefore, the angle θ between the screen mesh 85 and the portion of the squeegee that is in contact with the ink 82 is about 28°. When the ink 82 is applied by scanning the squeegee 89, a pattern 88 can be transferred to the subject 87.

Here, a structural object on which the pattern has been formed is baked and dried. The baking and drying are performed at 200° C. for 30 minutes in a nitrogen atmosphere under atmospheric pressure. In accordance with the above steps, the electrode including the peripheral portion having the gently tapered shape with its film thickness decreasing from the central portion toward the end portion and the projection portion having the shape with its tilt angle continuously changing from the peripheral portion toward the central portion can be formed.

As described above, by applying the present invention, it is possible to form the electrode including the peripheral portion having the gently tapered shape with its film thickness decreasing from the central portion toward the end portion and the projection portion having the shape with its tilt angle continuously changing from the peripheral portion toward the central portion by the screen printing method.

Figure 5C:
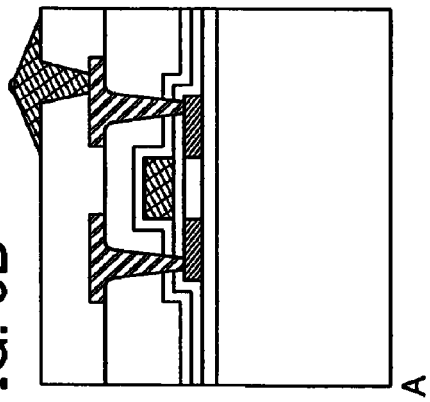
Figure 5B:
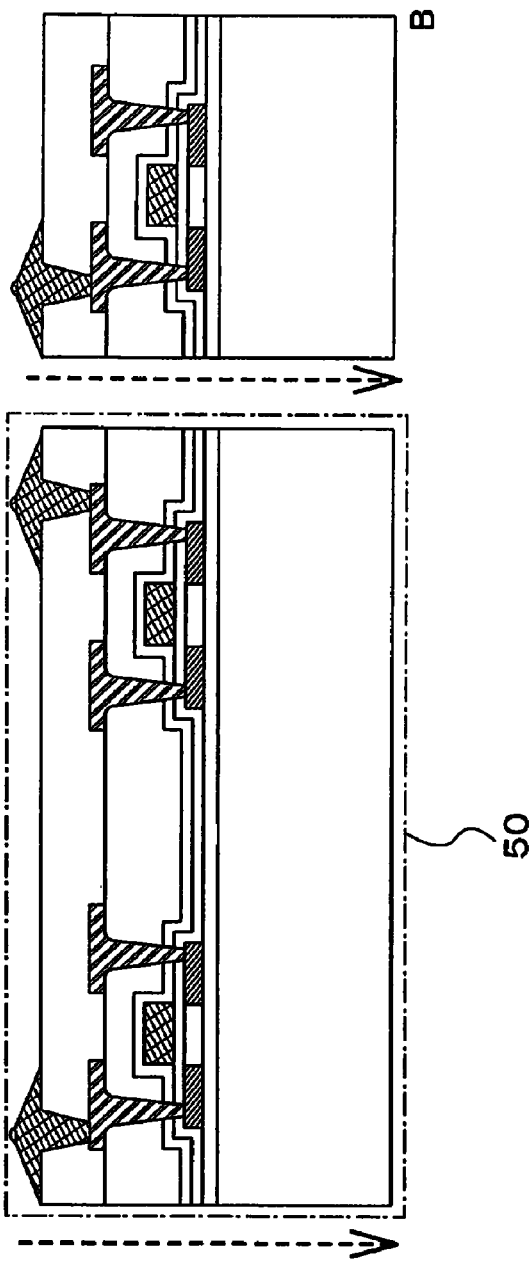

Next, the semiconductor devices each provided with the electrode are cut (see FIGS. 5A to 5C). The cutting may be carried out with a scribing apparatus, or by an ablation process using a laser beam (hereinafter, the laser beam includes laser light). A corner at the cut surface is rounded by the ablation process using a laser beam, which prevents chipping and cracking.

A laser used here for the cutting is preferably a solid-state laser capable of emitting a laser beam with a wavelength in an ultraviolet region. The ultraviolet region means a region in which the wavelength ranges from 1 to 380 nm. It is more preferable to use a Nd:YVO$_4$ laser. This is because a laser beam emitted from a Nd:YVO$_4$ laser with a wavelength in an ultraviolet region is absorbed in the substrate more easily than other laser beams with longer wavelengths, and allows the ablation process. Glass easily absorbs the laser beam in the ultraviolet region; therefore, the ablation process becomes easy when glass is used for the substrate.

Next, an electrode 53 and an antenna 55, which is an external circuit, are connected to each other at contact portions 54. As aforementioned, the electrode 53 is formed at a desired position of a stacked-layer body 50. An NCP 91 is formed over a peripheral portion of the electrode 53 having a tapered shape. The NCP 91 is formed of an insulating material, and functions as an adhesive which infills an interlayer space. The material of the NCP 91 is not limited in particular. The NCP 91 may be formed by a droplet discharging method, a spin coating method, or the like. The antenna 55 is prepared over the elements with the NCP 91 formed, and a load 93 is applied by a pressure bonding machine (see FIG. 7A). The load 93 applied at this time is preferably in the range of about 3 MPa to 4 MPa. It is more preferable to perform pressure bonding with heat when the load 93 is applied. The temperature of the NCP 91 at this time is preferably 120° C.

Figure 7A:
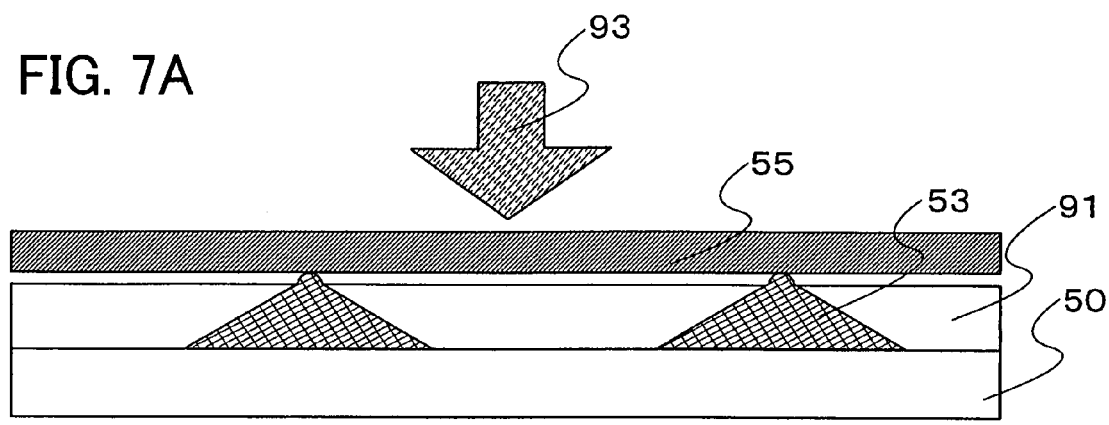
FIGS. 7A and 7B explain an example of forming an electrode of the present invention.
Figure 7B:
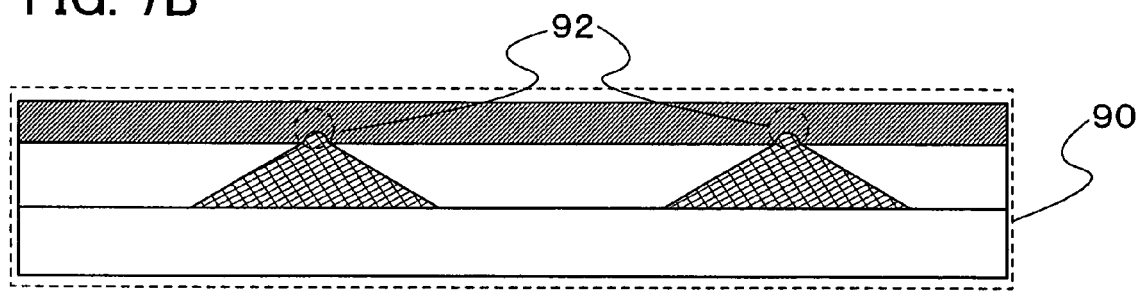

By the above step, the electrode 53 and the antenna 55 are connected to each other in such a way that the projection portion in the center of the electrode 53 is inserted in a portion 92 of the antenna 55, as shown in FIG. 7B. In accordance with the aforementioned steps, a semiconductor device 90 having the antenna can be manufactured. Although the electrode and the antenna are connected to each other after cutting the semiconductor devices in this embodiment mode, the semiconductor devices may be cut after connecting the electrode and the antenna to each other.

Figure 6A:
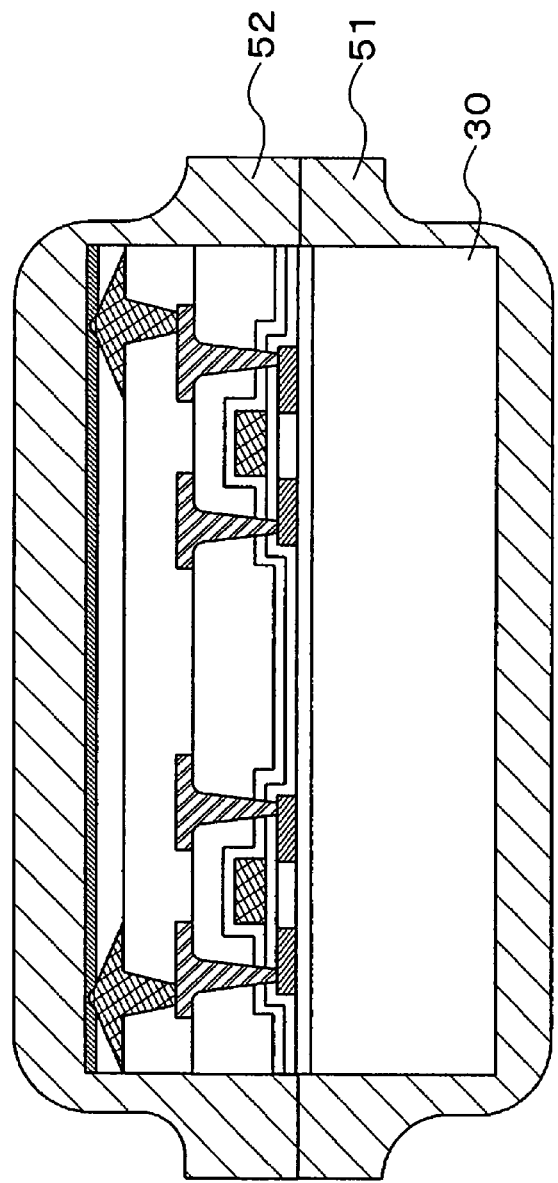
FIGS. 6A and 6B explain semiconductor devices of the present invention.
Figure 6B:
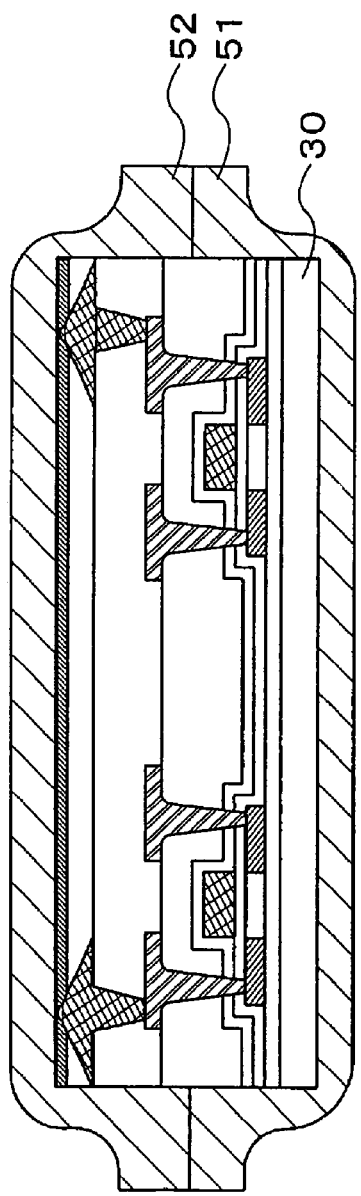

Next, the stacked-layer body 50 including the substrate 30 and the plurality of transistors 33 is sealed by using films 51 and 52, as necessary (see FIGS. 6A and 6B). The films 51 and 52 are formed of polyethylene, polycarbonate, polypropylene, polyester, vinyl, polyvinyl fluoride, vinyl chloride, ethylene vinyl acetate, urethane, polyethylene terephthalate, or the like, or a fibrous material (such as paper). Each of the films 51 and 52 may be a single layer or a stack of plural films. Moreover, each of the films 51 and 52 may have an adhesive layer on its surface. The adhesive layer is a layer including any of the following adhesives: a polyester based thermoplastic resin, a polyester based thermosetting resin, a polyester based ultraviolet curable resin, a polyolefin based thermoplastic resin, a polyolefin based thermosetting resin, a polyolefin based ultraviolet curable resin, a vinyl acetate resin based adhesive, a vinyl copolymer resin based adhesive, an epoxy resin based adhesive, a urethane resin based adhesive, a rubber based adhesive, an acrylic resin based adhesive, and the like.

The surfaces of the films 51 and 52 may be coated with a powder of silicon dioxide. By the coating, a waterproof property can be maintained even under an environment of high temperature or high humidity. That is, moisture resistance is improved. In addition, the surfaces of the films 51 and 52 may be coated with a conductive material such as indium tin oxide. When the surfaces of the films 51 and 52 are coated with a conductive material such as indium tin oxide, the coating material has static electricity; therefore, the plurality of transistors 33 can be protected from static electricity. In other words, an antistatic function can be provided. Moreover, the surfaces of the films 51 and 52 may be coated with a material including carbon as its main component (such as diamond-like carbon or carbon including nitrogen). By coating with these materials, the strength increases and the deterioration and damage of the semiconductor device can be suppressed. Moreover, the films 51 and 52 may be formed of a mixture of a material of the substrate (such as a resin) with one of silicon dioxide, a conductive material, and a material including carbon as its main component. An antistatic function can be provided by coating the surfaces of the films 51 and 52 with a surface-active agent or by directly kneading a surface-active agent into the films 51 and 52.

The plurality of transistors 33 are sealed by the films 51 and 52 by melting, in heat treatment, a surface of each of the films 51 and 52 or the adhesive layer on each of the films 51 and 52. Moreover, pressurization treatment is conducted as necessary to perform the adhesion.

In the semiconductor device in which the stacked-layer body 50 including the substrate 30 and the plurality of transistors 33 is provided between the films 51 and 52, intrusion of harmful gas, water, and impurity elements can be suppressed. Accordingly, the deterioration and damage of the plurality of transistors 33 can be suppressed and the reliability thereof can be improved.

Although the sealing is performed by the films after forming the antenna in this embodiment mode, the antenna may be formed after the sealing by the films. The films 51 and 52 may be used as the base, and one or both of the films 51 and 52 may be provided with a conductive layer functioning as an antenna. Then, the conductive layer provided to one or both of the films 51 and 52 is connected to the plurality of transistors 33 when the stacked-layer body 50 including the plurality of transistors 33 is sealed by the films 51 and 52. At this time, the stacked-layer body 50 including the plurality of transistors 33 is provided with the electrode including the peripheral portion having a gently tapered shape with its film thickness decreasing from the central portion toward the end portion and the projection portion having the shape with its tilt angle continuously changing from the peripheral portion toward the central portion. When each of the films 51 and 52 is provided with the conductive layer, the electrode is made to have contact with the conductive layers provided to the films 51 and 52 when sealing. As thus described, a semiconductor device capable of wireless communication can be manufactured.

The substrate 30 may be thinned by performing one or both of grinding and polishing on the other surface of the substrate 30 (a surface not provided with the thin films) by using one or both of a grinding apparatus (such as a grinding machine) and a polishing apparatus (such as a grind stone). After the thinning, irradiation with a laser beam is selectively performed to cut the insulating layers 32, 34, 35, 36, and 45, and the substrate 30 which has been thinned. Subsequently, the stacked-layer body 50 including the substrate 30 and the plurality of transistors 33 is sealed by using the films 51 and 52 (see FIG. 6B). It is to be noted that one or both of the grinding and polishing is/are preferably performed so that the substrate 30 has a thickness of 100 μm or less, more preferably 50 μm or less, and much more preferably 5 μm or less.

When one or both of the grinding and polishing is/are performed, a film is preferably provided so that the stacked-layer body 50 is fixed over the insulating layer 45 for protection. After the stacked-layer body 50 is fixed, one or both of the grinding and polishing is/are preferably performed on the other surface of the substrate 30. The film provided over the insulating layer 45 is preferably a film provided with a UV curable adhesive on its surface. Moreover, after performing one or both of the grinding and polishing, the film provided over the insulating layer 45 may be removed.

In this manner, when the substrate 30 is thinned, it is possible to easily cut the insulating layers 32, 34, 35, and 36, and the substrate 30 in a short period of time by using a laser beam. In addition, by thinning the substrate, a flexible semiconductor device can be provided. When the substrate is flexible, the semiconductor device can be easily mounted on a flexible product with improved design, and can be utilized in various fields.

In this manner, by the present invention, the electrode can be formed to have the shape that assures physical contact with the external circuit and makes electric contact therewith favorable, and the semiconductor device having the electrode can be manufactured. By the manufacturing according to the present invention, the integrated circuit and the antenna can be connected to each other favorably and highly reliable RFID tags can be manufactured with high yield.

According to the present invention, the area where the integrated circuit and the antenna are in contact with each other at their connection portion increases, allowing favorable connection. The increase in the contact area can make electrical connection favorable. In addition, an expensive ACP, which has been necessary to connect the integrated circuit and the antenna to each other favorably, is no longer necessary, and an inexpensive NCP (Non-Conductive resin Paste) can be used. Since the NCP does not include conductive particles, it allows connection without damaging the elements. Accordingly, highly reliable semiconductor devices capable of wireless communication can be manufactured at low cost and with high yield, and bad connection at the connection portion between the antenna and the integrated circuit can be reduced.

Although this embodiment mode explains the semiconductor device capable of wireless communication, the present invention is not limited to this, and the present invention can also be applied to any semiconductor device which needs connection to the external circuit, even to a semiconductor device that does not need an antenna.

Embodiment Mode 3

Figure 10:
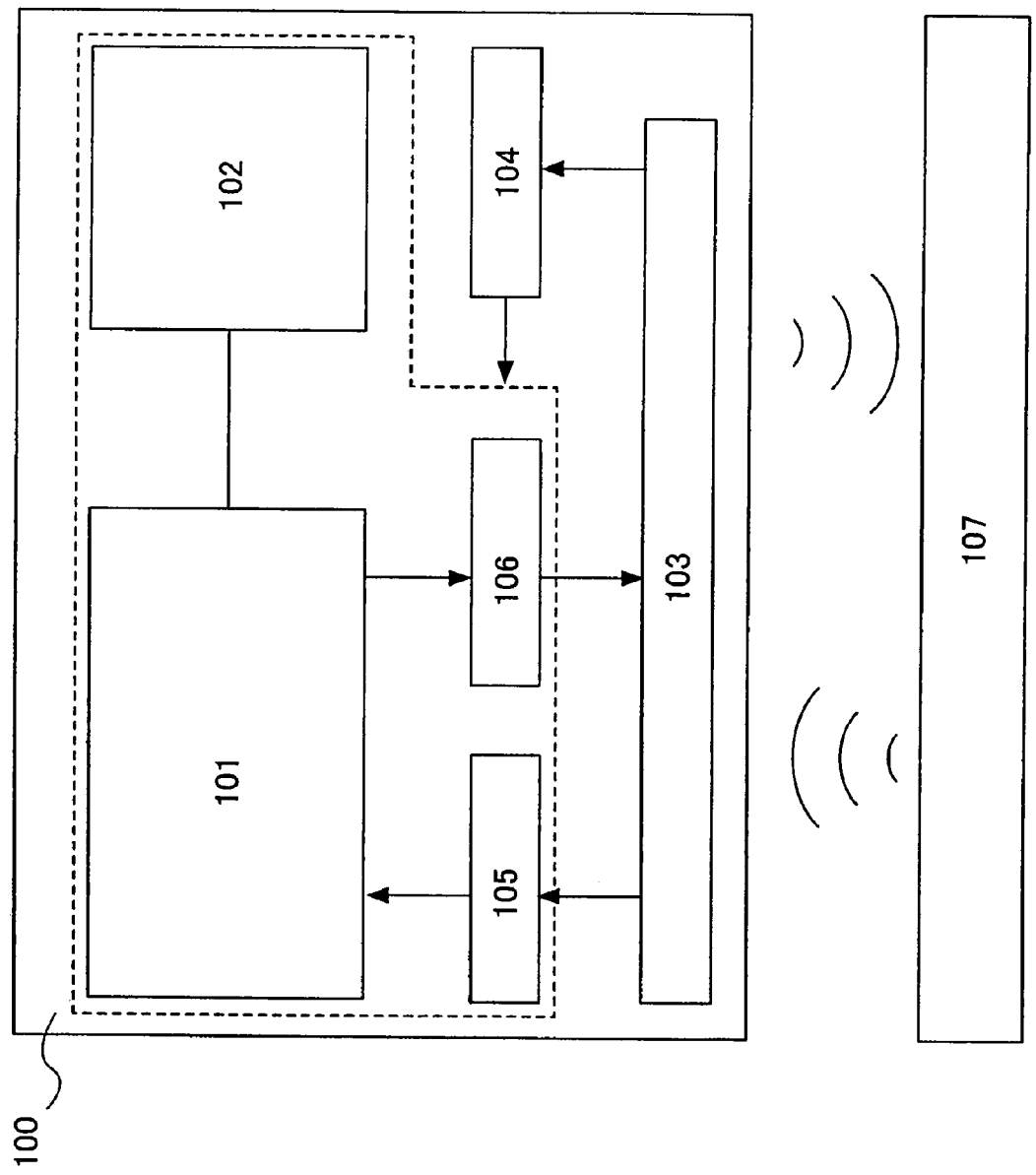
FIG. 10 explains a semiconductor device of the present invention.

Description is made of a semiconductor device capable of wireless communication to which the present invention is applied, with reference to FIG. 10. A semiconductor device 100 of the present invention includes an arithmetic processing circuit 101, a memory circuit 102, an antenna 103, a power source circuit 104, a demodulating circuit 105, and a modulating circuit 106. As each circuit in the semiconductor device 100, a circuit that is necessary in accordance with the purpose of the semiconductor device 100 is appropriately provided.

The arithmetic processing circuit 101 analyzes instructions, controls the memory circuit 102, outputs data for external transmission to the modulating circuit 106, and so on, based on signals inputted from the demodulating circuit 105.

The memory circuit 102 includes a circuit including a memory element and a controlling circuit for writing and reading data. The memory circuit 102 stores at least an identification number of a semiconductor device itself. The identification number is used to distinguish from another semiconductor device. The memory circuit 102 includes one or more selected from an organic memory, a DRAM (Dynamic Random Access Memory), an SRAM (Static Random Access Memory), an FeRAM (Ferroelectric Random Access Memory), a mask ROM (Read Only Memory), a PROM (Programmable Read Only Memory), an EPROM (Electrically Programmable Read Only Memory), an EEPROM (Electrically Erasable Programmable Read Only Memory), and a flash memory. An organic memory has a simple structure in which a layer including an organic compound is interposed between a pair of conductive layers; therefore, it has at least two advantages. One is that a manufacturing process can be simplified, which allows cost reduction. The other is that the area of the stacked-layer body can be decreased easily, which can achieve higher capacity easily. Therefore, an organic memory is preferably used for the memory circuit 102.

The antenna 103 converts a carrier wave supplied from a reader/writer 107 into an AC electric signal. Moreover, load modulation is applied by the modulating circuit 106. The power source circuit 104 generates a power source voltage by using the AC electric signal converted by the antenna 103 and supplies the power source voltage to each circuit.

The demodulating circuit 105 demodulates the AC electric signal converted by the antenna 103 and supplies the demodulated signal to the arithmetic processing circuit 101. The modulating circuit 106 applies load modulation to the antenna 103 based on the signal supplied from the arithmetic processing circuit 101.

The reader/writer 107 receives as a carrier wave, the load modulation applied to the antenna 103. The reader/writer 107 transmits the carrier wave to the semiconductor device 100. The carrier wave is an electromagnetic wave received and transmitted by the reader/writer 107, and the reader/writer 107 receives the carrier wave which has been modulated by the modulating circuit 106.

With the use of the electrode of the present invention, i.e., the electrode including the peripheral portion having the gently tapered shape with its film thickness decreasing from the central portion toward the end portion and the projection portion having the shape with its tilt angle continuously changing from the peripheral portion toward the central portion, the semiconductor device having the electrode which assures physical contact with the antenna, which is an external circuit, and makes electrical connection therewith favorable can be manufactured. For example, connection between the antenna 103 and the demodulating circuit 105 or connection between the antenna 103 and the modulating circuit 106 can be made favorable. Therefore, in a case of manufacturing an RFID tag, for example, the semiconductor device with high reliability in which the integrated circuit and the antenna are electrically connected to each other favorably can be manufactured with high yield.

The semiconductor device having a function of transmitting and receiving an electromagnetic wave wirelessly, which is described in this embodiment mode, is referred to as an RFID (Radio Frequency IDentification) tag, an RF chip, an RF tag, an IC chip, an IC tag, an IC label, a wireless chip, a wireless tag, an electronic chip, an electronic tag, a wireless processor, a wireless memory, or the like. By the present invention, highly reliable semiconductor devices capable of wireless communication in each of which the integrated circuit portion and the antenna are electrically connected to each other favorably can be manufactured with high yield.

Embodiment Mode 4

The present invention can be applied not only to the semiconductor device capable of wireless communication without contact, typified by an RFID tag, as described in Embodiment Mode 2 but also to terminal portions of various integrated circuits to be connected to external circuits. As one example thereof, description is made of a NOR type flash memory manufactured by applying the present invention, with reference to FIGS. 13A to 15B. The NOR type flash memory is attached onto, for example, a mother board (also called main board) and is used to record BIOS (Basic Input Output System). A mother board is one of components of a computer, and refers to a substrate to which various kinds of modules such as a CPU (Central Processing Unit) are attached.

A number of steps in the manufacturing of an element of the flash memory are similarly to those of a TFT. A memory element 150 is hereinafter explained with reference to FIGS. 13A and 13B. First, an insulating layer 132 is formed on one surface of the substrate 130. Next, a layer including a plurality of transistors, which includes a semiconductor layer 146, is formed over the insulating layer 132. The semiconductor layer 146 has impurity regions 147 and a channel formation region 148. Subsequently, an insulating layer 133, a floating gate layer 139, and an insulating layer 134 are formed over the layer including the plurality of transistors. Next, a conductive layer 149 is formed and insulating layers 135 and 136 are sequentially formed. Then, a conductive layer 137 to be connected to source or drain regions of each of the plural transistors through openings provided in the insulating layers 133, 134, 135, and 136 provided in the plural transistors is formed. Next, an insulating layer 145 is formed covering the conductive layer 137.

The substrate 130 may be a glass substrate, a plastic substrate, a quartz substrate, or the like. A glass substrate or a plastic substrate is preferably used. When a glass substrate or a plastic substrate is used as the substrate, it is easy to manufacture a semiconductor device with a length of 1 meter or more on one side or a semiconductor device with a desired shape.

The insulating layer 132 has a function of preventing the intrusion of impurities from the substrate 130. The insulating layer 132 is formed by a silicon oxide based film or a silicon nitride based film as a single layer or stacked layers by a sputtering method, a plasma CVD method, or the like. The insulating layer 132 does not have to be provided if unnecessary. The semiconductor layer 146 is formed of silicon. A method of forming the semiconductor layer 146 is similar to that of the insulating layer 32 in Embodiment Mode 2.

The semiconductor layer 146 has the impurity regions 147 each functioning as a source or drain region and the channel formation region 148. To the impurity regions 147, an impurity element imparting N-type conductivity (an element belonging to Group 15, such as phosphorus (P) or arsenic (As)) or an impurity element imparting P-type conductivity (such as boron (B) or aluminum (Al)) is added. The impurity element may be introduced by a method using a diffusion source, an ion implantation method, or the like. Although not shown, an LDD region is preferably formed before introducing the impurity element. The insulating layers 133 and 134 can be formed by a similar method to the insulating layer 132.

The insulating layers 135 and 136 are formed of an inorganic or organic material as a single layer or stacked layers by an SOG (Spin-On-Glass) method, a droplet discharging method, a screen printing method, or the like. For example, the insulating layer 135 may be formed by a silicon nitride based film, while the insulating layer 136 may be formed by a film including an organic material. The insulating layers 135 and 136 may be formed by a sputtering method, a plasma CVD method, or the like similarly to the insulating layers 132, 133, and 134.

The floating gate layer 139, the conductive layer 137, and the conductive layer 149 are each formed of a conductive substance, and may be formed as a single layer or stacked layers by a CVD method, a sputtering method, a droplet discharging method, or the like.

The insulating layer 145 is formed of an inorganic or organic material as a single layer or stacked layers by an SOG (Spin-On-Glass) method, a droplet discharging method, a screen printing method, or the like similarly to the insulating layers 135 and 136. The insulating layer 145 may be formed by a sputtering method, a plasma CVD method, or the like similarly to the insulating layers 132, 133, and 134.

Electrodes 153 and 154 are formed by a screen printing method in a region where the conductive layer 137 is exposed, similarly to Embodiment Mode 2. After forming the electrodes, the elements are cut into each element (see FIGS. 13A and 13B).

Although only the memory element is formed in the shown structure, the present invention is not limited to this structure. The elements provided over the substrate 130 may be appropriately adjusted in accordance with the purpose of the semiconductor device. For example, an erasure voltage controlling circuit is preferably mounted. Another element such as a resistor or a capacitor may be formed as necessary.

Figure 14:
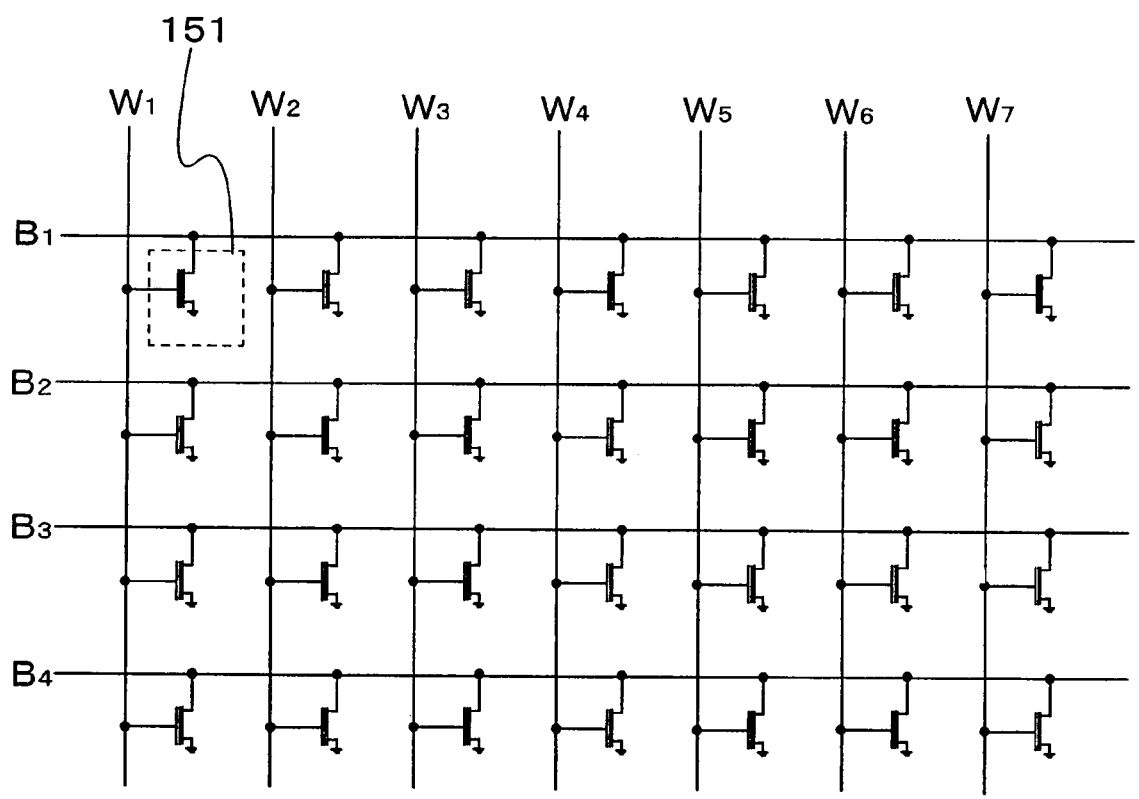
FIG. 14 is a circuit diagram of a NOR type flash memory.

An example of a circuit diagram of the aforementioned flash memory is shown in FIG. 14. A writing operation and a reading operation are carried out by using word lines $W_1$ to $W_7$ and bit lines $B_1$ to $B_4$. The word lines and the bit lines are connected to circuits controlling the operations. Alternatively, these lines may be connected to wirings extending to circuits controlling the operations in a later step. Moreover, the word lines are connected to gate electrodes (control gates) in memory elements and the bit lines are connected to source or drain electrodes in the memory elements. A region 151 surrounded by a dotted line corresponds to a unit memory element.

Although not shown, it is also possible to mount a small device with a more complicated circuit structure by employing a multilayer wiring structure.

An example of a structure using a single-crystal silicon substrate as the substrate that forms a memory element 250 is shown in FIGS. 15A and 15B. When the substrate is a single-crystal silicon substrate as shown in FIGS. 15A and 15B, a channel region can be formed in the substrate; therefore, it is not necessary to form a semiconductor layer functioning as a transistor. Moreover, it is not necessary to form an insulating layer for preventing the intrusion of impurities from the substrate.

The single-crystal silicon substrate 230 includes semiconductor region 246, which comprises impurity regions 247 each functioning as a source or drain region and a channel formation region 248. An impurity element imparting N-type conductivity (an element belonging to Group 15, such as phosphorus (P) or arsenic (As)) or an impurity element imparting P-type conductivity (such as boron (B) or aluminum (Al)) is added to the impurity regions 247. The impurity element may be introduced by a method using a diffusion source, an ion implantation method, or the like. Insulating layers 233 and 234 are formed by a silicon oxide based film or a silicon nitride based film as a single layer or stacked layers by a sputtering method, a plasma CVD method, or the like.

Insulating layers 235 and 236 are formed of an inorganic or organic material as a single layer or stacked layers by an SOG (Spin-On-Glass) method, a droplet discharging method, a screen printing method, or the like. For example, the insulating layer 235 may be formed by a silicon nitride based film and the insulating layer 236 may be formed by a film including an organic material. In addition, the insulating layers 235 and 236 may be formed by a sputtering method, a plasma CVD method, or the like similarly to the insulating layer 233 and the like.

A floating gate layer 239, a conductive layer 237, and a conductive layer 249 each include a conductive substance and may be formed as a single layer or stacked layers by a CVD method, a sputtering method, a droplet discharging method, or the like.

An insulating layer 245 is formed of an inorganic or organic material as a single layer or stacked layers by an SOG (Spin-On-Glass) method, a droplet discharging method, a screen printing method, or the like similarly to the insulating layers 235 and 236. The insulating layer 245 may be formed by a sputtering method, a plasma CVD method, or the like similarly to the insulating layers 233 and 234.

Electrodes 253 and 254 are formed in a region where the conductive layer 237 is exposed, by a screen printing method similarly to Embodiment Mode 2. After forming the electrodes, the elements are divided from each other (see FIGS. 15A and 15B).

An integrated circuit cut into each element, where the electrodes 153 and 154 (or the electrodes 253 and 254) are formed, is connected to an external circuit having a desired wiring pattern formed over a substrate.

Although only the NOR type flash memory is described here, the present invention is not limited to this, and the present invention can also be applied to a NAND type flash memory. Moreover, the present invention can be applied not only to the flash memories but also to any of memory elements having thin film integrated circuits.

By the present invention, the semiconductor device which has the electrode that is physically connected to the external circuit and electrically connected thereto favorably can be manufactured. By applying the present invention, the highly reliable semiconductor device in which the integrated circuit (such as a flash memory) and the external circuit having a desired wiring pattern formed over the substrate (such as a wiring including a pattern formed over a mother board) are favorably connected to each other can be manufactured with high yield.

Embodiment Mode 5

The present invention can be applied not only to the RFID tag explained in Embodiment Modes 2 and 3 and the flash memory explained in Embodiment Mode 4, but also to integrated circuits with every kind of structure. This embodiment mode will describe a structure different from the modes explained in Embodiment Modes 2 to 4.

Figure 16A:
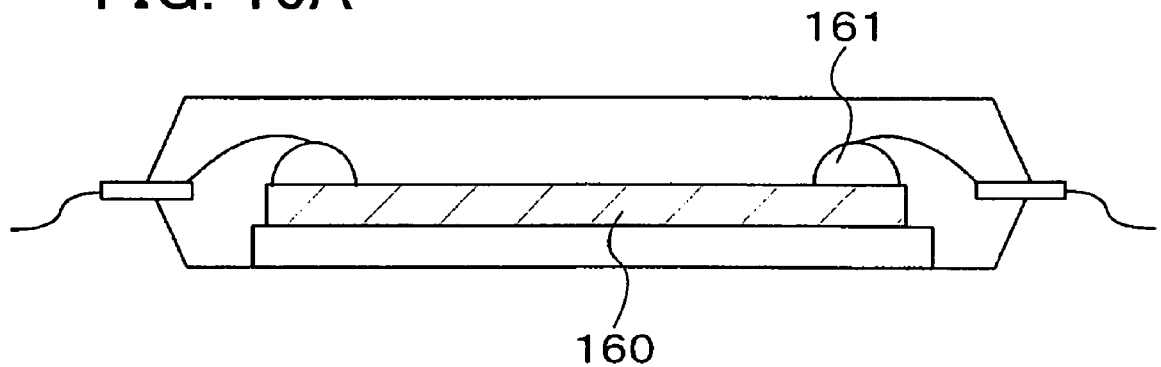
FIGS. 16A to 16C show a mode of mounting a semiconductor device.
Figure 16B:
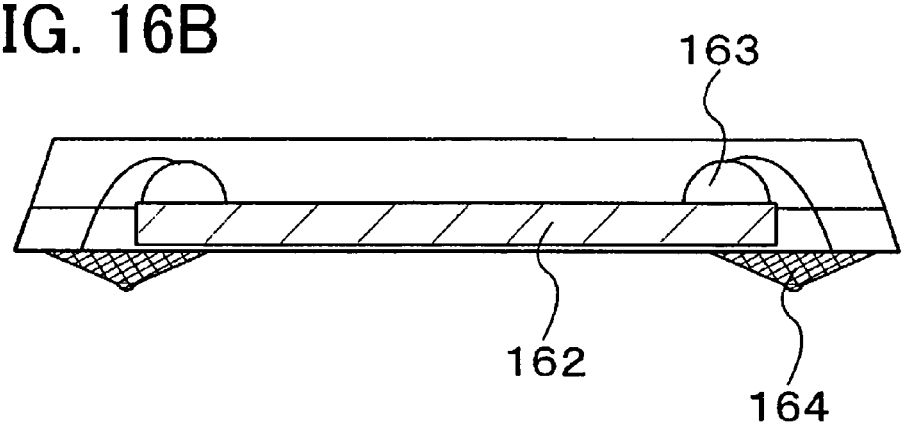
Figure 16C:
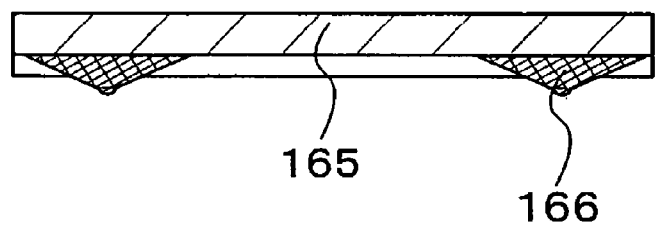

FIGS. 16A to 16C are cross-sectional views showing typical mounting modes. FIG. 16A shows a mounting method called fine pitch QFP (Quad Flat Package), and pins for external input and output are arranged at four sides of an integrated circuit. FIG. 16B shows a mounting method called fine pitch BGA (Ball Grid Array), and pads for external input and output are arranged at a bottom surface of a flat package. FIG. 16C shows a mounting method called a wafer level CSP (Chip Size Package), which is a state-of-the-art semiconductor mounting method aiming at the same size as a single chip.

In FIG. 16A, a semiconductor element 160 is connected to an external circuit through a connection portion 161. In FIG. 16B, a semiconductor element 162 is connected to an external circuit through a connection portion 163 and an electrode 164. In FIG. 16C, a semiconductor element 165 is connected to an external circuit through an electrode 166.

By applying the present invention, in the structures shown in FIGS. 16B and 16C, easier physical connection and more favorable electrical connection with an external circuit can be achieved as compared with a conventional spherical electrode. The structure shown in FIG. 16C is preferable because a mounting step, which has been one of posterior steps conventionally, can be performed sequentially in a manufacturing line of anterior steps.

By applying the present invention, the semiconductor device having the electrode which is physically connected and electrically connected favorably to an external circuit can be manufactured. By applying the present invention, the highly reliable semiconductor device in which the integrated circuit (such as a flash memory) and the external circuit having a desired wiring pattern formed over the substrate (such as a wiring pattern formed over a mother board) are connected favorably to each other can be manufactured with high yield.

Embodiment Mode 6

Figure 11E:
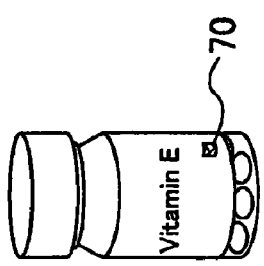
FIGS. 11A to 11F explain semiconductor devices of the present invention.
Figure 11F:
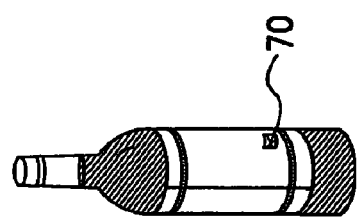
Figure 11C:
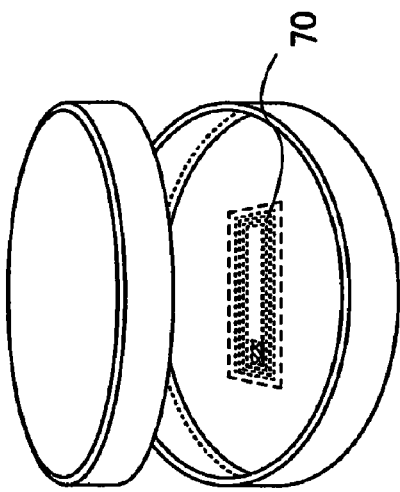
Figure 11D:
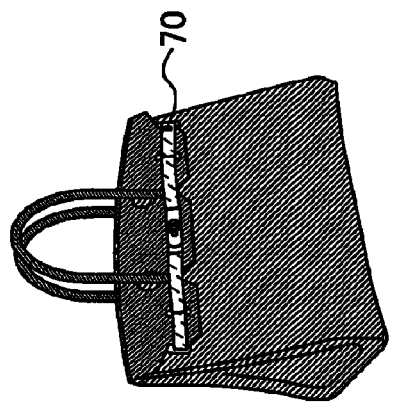
Figure 11A:
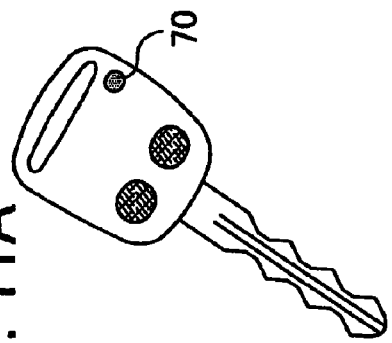
Figure 11B:
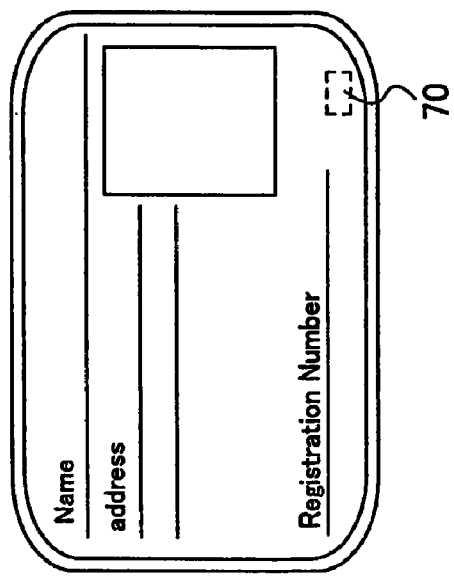

A semiconductor device 70 capable of wireless communication to which the present invention is applied can be provided to various products and used for various systems. The products include, for example, a key (see FIG. 11A), bank notes, coins, documents of value, bearer bonds, identification certificates (such as a driver license or a residence card, see FIG. 11B), books, containers (such as a petri dish, see FIG. 11C), pack cases (such as package paper or a bottle, see FIGS. 11E and 11F), recording media (such as a disk or a video tape), vehicles (such as a bicycle), accessories (such as a bag or glasses, see FIG. 11D), foods, clothes, general merchandise, electronic appliances (such as a liquid crystal display device, an EL display device, a television device, or a mobile terminal), and the like. The semiconductor device of the present invention is fixed to the product with various shapes as above by attaching the device on its surface or embedding the device inside. The systems include a product management system, an authorization function system, a circulation system, and the like. By the use of the semiconductor device of the present invention, the systems can have higher reliability. This embodiment mode can be freely combined with another embodiment mode and another embodiment.

Embodiment 1

An electrode formed by applying the present invention is explained with reference to drawings. As explained in Embodiment Mode 1, the electrode of the present invention can be formed only under the condition within the predetermined range. Therefore, description is hereinafter made of conditions under which pressure and speed to scan a squeegee are variously changed in forming the electrode of the present invention by screen printing so as to form the electrode including a projection portion and a peripheral portion having tapered shapes, the peripheral portion being gently tilted with its film thickness decreasing from a central portion toward an end portion.

The screen printing method used in this embodiment is similar to that in Embodiment Mode 2. That is to say, the screen printing was performed in the manner explained in Embodiment Mode 2 with reference to FIGS. 8A and 8B. FIGS. 8A and 8B are cross-sectional views showing pattern formation by screen printing. Here, a silver paste was used as the ink 82. In the case of using the silver paste, an epoxy resin was used as a binder in the paste and butylcarbitol acetate was used as a solvent. The silver paste had a viscosity of 40 Pa·s. In the screen printing, a printing plate having the exterior frame 80 and the screen mesh 85 was used. In order to fill the holes 83 of the screen mesh 85 with the ink 82, the ink 82 was applied to the screen mesh 85 using the scraper 81. By the application of the ink 82, the holes 83 were filled with the ink, thereby obtaining the holes 84 filled with the ink. Next, the subject 87 (For example, a semiconductor chip or the like) on which the electrode was to be formed was provided on the printing stage 86 and the printing stage 86 was then provided under the printing plate.

After that, printing was performed by scanning the squeegee 89 over the screen mesh 85. FIG. 9 shows the shape and size of the squeegee used in this embodiment. Here, the squeegee with its corner chamfered was used. The squeegee 89 is DB-R Squeegee (manufactured by Microtek, Inc.) with a hardness of 70±5°. A portion of the squeegee 89 that is in contact with the ink 82 has been chamfered. The angle between the bottom of the squeegee and the chamfered portion is 132°, and the squeegee is scanned tilted by about 20° from a perpendicular state. Therefore, the angle θ between the screen mesh 85 and the portion of the squeegee that is in contact with the ink 82 is about 28°. When the ink 82 is applied by scanning the squeegee 89, the pattern 88 is transferred to the subject 87. It is to be noted that the size of the printing plate is approximately 380 mm in length and 380 mm in width. The surface on which the electrode is formed is a surface of a glass substrate with a thickness of 0.7 mm, and the distance between the printing plate and the surface on which the electrode is formed is set to be 0.7 mm.

The electrode formed as aforementioned is shown in FIGS. 1A and 1B. In FIGS. 1A and 1B, the electrode 12 is formed over a substrate 11, and the electrode 12 and an antenna 14 are connected to each other in such a way that the electrode is inserted in the antenna 14. An NCP 13 is provided between the antenna 14 and the peripheral portion of the electrode 12 having the tapered shape.

The shape of the formed electrode was observed while changing the conditions at the time of forming the electrode. That is, the scanning speed of the squeegee was set to 60, 80, 100, 120, 150, 180, and 200 mm/sec and the pressure at the scanning of the squeegee was changed every 0.005 MPa in the range of 0.15 MPa to 0.2 MPa, and whether or not the electrode having the shape of the present invention was formed over the entire surface was checked.

Figures 12A, 12B:
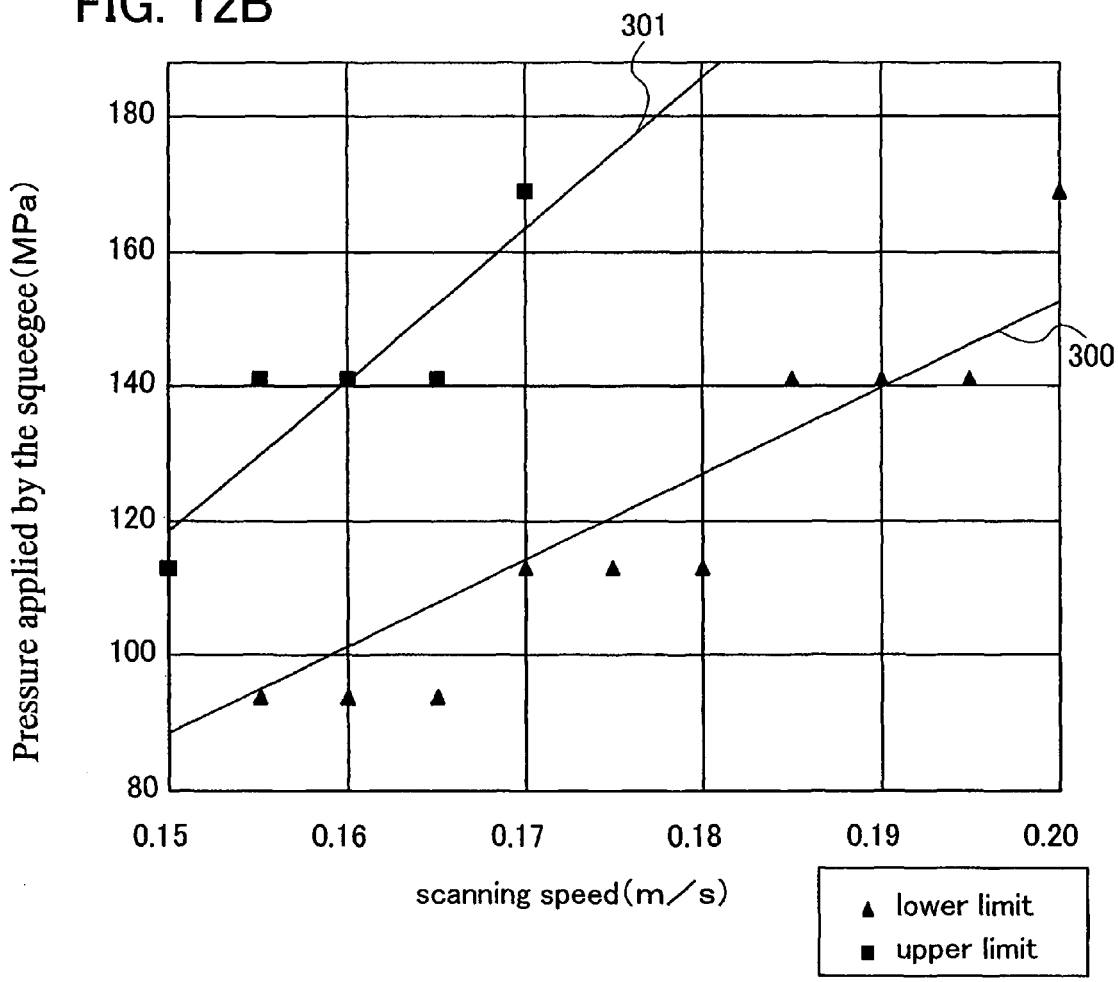
FIGS. 12A and 12B show the range in which an electrode with a shape of the present invention can be formed.

FIG. 12A shows a result of the above experiment. The condition under which the electrodes are each formed to have the shape of the present invention is shown by a symbol "○" and the case in which electrodes are each formed not to have the shape of the present invention on the partial or entire surface is shown by a symbol "x". For example, when the pressure of the squeegee is 0.15 MPa, the electrodes each having the shape of the present invention were formed over the entire surface only at a scanning speed of the squeegee of 120 m/sec. Moreover, in the case where the electrodes each not having the shape of the present invention were formed over the partial or entire surface, the formed electrodes had various shapes. In FIG. 12A, the electrodes had an incomplete shape when the pressure was more than 120 MPa, i.e., in a region surrounded by a dotted line and had such a shape that the apex was crushed and the projection portion was not formed in the center in the other "x" regions.

The range within which the electrode having the shape of the present invention is formed was calculated based on the data of FIG. 12A. An approximate line 300 and an approximate line 301 were formed concerning the upper limit and the lower limit of the pressure applied by the squeegee in each scanning speed of the squeegee. This is shown in FIG. 12B in which the horizontal axis (x axis) represents the scanning speed (m/sec) of the squeegee while the vertical axis (y axis) represents the pressure (MPa) applied by the squeegee.

In FIG. 12B, the vertical axis (y axis) shows not the pressure of the squeegee but the pressure (MPa) applied by the squeegee. The pressure applied by the squeegee is a component of the pressure of the squeegee in a direction perpendicular to the screen. When the pressure of the squeegee is expressed as P, the pressure applied by the squeegee becomes approximately P sin 70° in this embodiment. When the pressure P of the squeegee is 200 MPa, the pressure applied by the squeegee is approximately 188 MPa, and when the pressure P of the squeegee is 100 MPa, the pressure applied by the squeegee is approximately 94 MPa. Moreover, when the pressure P of the squeegee is 60 MPa, the pressure applied by the squeegee is approximately 56 MPa.

When the approximate lines are drawn as shown in FIG. 12B, the straight line of the upper limit becomes y=2240x−217 and that of the lower limit becomes y=1280x−103. That is, when the scanning speed is x (m/sec) and the pressure applied by the squeegee is y (MPa), it can be said that the range within which the electrode of the present invention is formed is about 0.15≦x≦0.20, 94≦y≦188, and 1280x−103≦y≦2240x−217.

As thus described in this embodiment, the electrode having the shape of the present invention is formed only when the squeegee speed and the pressure applied by the squeegee are in the predetermined ranges.

This application is based on Japanese Patent Application serial no. 2006-123589 filed in Japan Patent Office on Apr. 27, 2006, the entire contents of which are hereby incorporated by reference.

The invention claimed is:

1. A semiconductor device comprising:
an integrated circuit; and
an electrode, wherein the integrated circuit is electrically connected to an external circuit through the electrode,
wherein the electrode has a first portion and a second portion,
wherein the first portion is a projection, all regions of the projection are rounded,
wherein all regions of the projection are inserted into the external circuit,
wherein a taper angle of the first portion is larger than a taper angle of the second portion,
wherein a non-conductive resin paste is interposed between the external circuit and the second portion,
wherein the non-conductive resin paste is in contact with an upper surface of the second portion and the external circuit,
wherein a side surface of the projection is in contact with the external circuit,
wherein the non-conductive resin paste comprises a region, a whole of the region overlapping with the second portion, and the external circuit in a direction perpendicular to a plane on which the integrated circuit or the external circuit is formed,
wherein a first part of the second portion is closer to the projection than a second part of the second portion, and
wherein an angle between an upper surface of the first part and a bottom surface of the electrode is larger than an angle between an upper surface of the second part and the bottom surface.

2. The semiconductor device according to claim 1, wherein the external circuit is an antenna.

3. The semiconductor device according to claim 1, wherein the external circuit is a conductive film provided over a base.

4. The semiconductor device according to claim 3, wherein the base is a film.

5. The semiconductor device according to claim 1, wherein an insulating substance is provided between the external circuit and an edge portion of the electrode.

6. The semiconductor device according to claim 1, wherein the electrode is formed by a screen printing method.

7. An electronic appliance comprising:
a semiconductor device including an integrated circuit and an electrode; and
an external circuit electrically connected to the integrated circuit through the electrode,
wherein the electrode has a first portion and a second portion,
wherein the first portion is a projection, all regions of the projection are rounded,
wherein all regions of the projection are inserted into the external circuit, wherein a taper angle of the first portion is larger than a taper angle of the second portion, wherein a non-conductive resin paste is interposed between the external circuit and the second portion, wherein the non-conductive resin paste is in contact with an upper surface of the second portion and the external circuit, wherein a side surface of the projection is in contact with the external circuit, wherein the non-conductive resin paste comprises a region, a whole of the region overlapping with the second portion, and the external circuit overlap in a direction perpendicular to a plane on which the integrated circuit or the external circuit is formed, wherein a first part of the second portion is closer to the projection than a second part of the second portion, and wherein an angle between an upper surface of the first part and a bottom surface of the electrode is larger than an angle between an upper surface of the second part and the bottom surface.

8. An electronic appliance comprising:

a semiconductor device including an integrated circuit a first electrode, and a second electrode; and an external circuit electrically connected to the integrated circuit through the first electrode and the second electrode, wherein the first electrode has a first portion and a second portion, wherein the first portion is a projection, all regions of the projection are rounded, wherein all regions of the projection are inserted into the external circuit, wherein a taper angle of the first portion is larger than a taper angle of the second portion, wherein a non-conductive resin paste is interposed between the external circuit and the second portion, wherein the non-conductive resin paste is in contact with an upper surface of the second portion and the external circuit, wherein a side surface of the projection is in contact with the external circuit, wherein the non-conductive resin paste comprises a region, a whole of the region overlapping with the second portion, and the external circuit in a direction perpendicular to a plane on which the integrated circuit or the external circuit is formed, wherein a first part of the second portion is closer to the projection than a second part of the second portion, and wherein an angle between an upper surface of the first part and a bottom surface of the first electrode is larger than an angle between an upper surface of the second part and the bottom surface.

9. The electronic appliance according to claim 7 or 8, wherein the external circuit is an antenna.

10. The electronic appliance according to claim 7 or 8, wherein the external circuit is a conductive film provided over a base.

11. The electronic appliance according to claim 10, wherein the base is a film.

12. The electronic appliance according to claim 7, wherein the electrode is connected to the external circuit through an insulating substance.

13. The electronic appliance according to claim 7, wherein the electrode is formed by a screen printing method.

14. The electronic appliance according to claim 8, wherein the first electrode is connected to the external circuit through an insulating substance.

15. The electronic appliance according to claim 8, wherein the first electrode is formed by a screen printing method.

16. The semiconductor device according to claim 1, wherein an edge portion of the electrode is interposed between the non-conductive resin paste and the external circuit.

17. The semiconductor device according to claim 1, wherein a top surface of the projection is rounded.

* * * * *

UNITED STATES PATENT AND TRADEMARK OFFICE
CERTIFICATE OF CORRECTION

PATENT NO. : 8,378,484 B2
APPLICATION NO. : 11/790481
DATED : February 19, 2013
INVENTOR(S) : Daiki Yamada et al.

It is certified that error appears in the above-identified patent and that said Letters Patent is hereby corrected as shown below:

In the Claims:

At column 19, line 12, delete the word "overlap".

Signed and Sealed this
Second Day of July, 2013

Teresa Stanek Rea
*Acting Director of the United States Patent and Trademark Office*